(12) United States Patent
Kurumada et al.

(10) Patent No.: US 7,254,088 B2
(45) Date of Patent: Aug. 7, 2007

(54) SEMICONDUCTOR MEMORY

(75) Inventors: Marefusa Kurumada, Kyoto (JP); Yutaka Terada, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 46 days.

(21) Appl. No.: 11/338,670

(22) Filed: Jan. 25, 2006

(65) Prior Publication Data

US 2006/0126420 A1 Jun. 15, 2006

(51) Int. Cl.
*G11C 8/00* (2006.01)
(52) U.S. Cl. .................. 365/230.05; 365/191; 365/194; 365/203; 365/205
(58) Field of Classification Search ............... 365/191, 365/194, 203, 205, 230.05
See application file for complete search history.

(56) References Cited

U.S. PATENT DOCUMENTS 5,335,199 A 8/1994 Aoyama

| | | | | |
|---|---|---|---|---|
| 6,473,357 B1 * | 10/2002 | Fan et al. | ............... | 365/230.05 |
| 6,785,157 B2 * | 8/2004 | Arimoto et al. | ............. | 365/149 |
| 6,958,507 B2 * | 10/2005 | Atwood et al. | ............. | 257/296 |

FOREIGN PATENT DOCUMENTS

JP 07-175713 7/1995

* cited by examiner

*Primary Examiner*—Hoai V. Ho
(74) *Attorney, Agent, or Firm*—McDermott Will & Emery LLP

(57) ABSTRACT

In a multiport memory, in the event of simultaneous read/write operation for the same row address, a read word line pulse signal, output from a read control circuit for memory access based on an externally supplied read enable signal and read clock signal, is input into a write control circuit, to delay start of the write operation until termination of the read operation. This can delay the timing of activating a write word line by a write row decoder behind the timing of activating a read word line by a read row decoder, to allow the read operation first followed by the write operation. Therefore, since the read operation is performed while the write word line being kept closed, the trouble of data processing becoming uncertain due to addition of the load of a write bit line to a read bit line can be prevented.

15 Claims, 22 Drawing Sheets

116a Read control circuit

106a Write control circuit

116b Read control circuit

101' Write row decoder

116b' Read control circuit

106c Write control circuit

102 Write address latch

SEMICONDUCTOR MEMORY

CROSS-REFERENCE TO RELATED APPLICATIONS

This application relates to Japanese Patent Application No. 2004-319351 filed in Japan on Nov. 2, 2004, the entire contents of which are hereby incorporated by reference.

BACKGROUND OF THE INVENTION

The present invention relates to a multiport semiconductor memory device.

FIG. 22 shows a conventional dual-port RAM, in which one cycle is time-divided into two to provide access time periods dedicated to A port 12 and B port 13. Specifically, in the former half of the cycle, a chip enable signal /$CE_A$ for the A port 12 is put in a low level (selected) to allow access with an address $ADR_A$, while in the latter half of the cycle, a chip enable signal /$CE_B$ for the B port 13 is put in a low level (selected) to allow access with an address $ADR_B$. Therefore, even if both ports 12 and 13 happen to access the same address for write in the same cycle, such access attempts will not conflict with each other ideally due to the time-division processing. Japanese Laid-Open Patent Publication No. 7-175713 describes a method for controlling such access of different ports.

Although not shown in FIG. 22, a dual-port memory cell array 11 has a plurality of memory cells, each of which is connected with bit lines each for read and write via drain-source connection of relevant access transistors. A word line for sending an activation signal is connected to the gate of each access transistor. The activation signal is sent from each port to a word line corresponding to an address to which access is intended, to thereby turn ON the relevant access transistors. This brings relevant bit lines for write or read into conduction with the memory cell via the access transistors, enabling read or write of data.

However, even if the time-division processing is performed ideally, the conventional dual-port semiconductor memory device has the following problem. While processing for one port has not yet been finished, the other port may start access due to an error in the delay time in the ports or any other reason, and this may cause accessing to the same row address in the same cycle. Moreover, if one port is to perform read, the relevant word line of this read port will be activated. Since the relevant word line of the other port is also activated, the access transistors for the two ports will be turned ON simultaneously. This will result in the two ports being electrically connected to the same node of the memory cell via the access transistors, and thus the relevant bit line of the other port, which is unnecessary for the read operation of the one port, will become connected with the memory cell. That is, the bit lines of the two ports will be brought into conduction to each other, and as a result, the load of the bit line coupled to the other port will be added to the bit line of the one port that is to perform read.

As described above, the end part of processing of the previously accessing port may overlap the beginning part of processing of the subsequently accessing port in the same cycle, and as a result, the read bit line may be burdened with an unnecessary load of the bit line of the other port. This will cause a delay of a signal for read. To ensure the read data processing, therefore, the read time must be made long.

If the above event is not considered, and the time-division processing is uniformly applied to the case of occurrence of access to the same address from two ports in the same cycle as is applied to the other normal cases requiring no longer read time, the following problem will occur. That is, if the previously accessing port is a read port, the port will fail to secure a sufficient read time due to access from the subsequently accessing port of which processing overlaps the processing of the previously accessing port. If the subsequently accessing port is a read port, the read time will become long due to the previously accessing port and thus fail to secure a sufficient read time within the set cycle. In both cases, data processing will become uncertain.

The above problem will also arise in other multiport semiconductor memory devices having a plurality of ports other than two.

SUMMARY OF THE INVENTION

An object of the present invention is providing a semiconductor memory device having a plurality of ports, capable of ensuring data read processing even when interference occurs between ports accessing the same row address simultaneously and one of the interfering access operations is read operation that is easily affected by the other access operation causing a longer processing time at the occurrence of processing overlap.

To attain the above object, according to the present invention, when the same row address is selected with access from a plurality of ports, adjustment may be made for the timing of output of activation signals for activating access transistors that connect bit lines to a memory cell. That is, while access from the first port is underway, access from the second port may be made causing the possibility of occurrence of interference due to the access from the second port. In such a case, a signal based on a control signal output from a control circuit of the first port for memory access is also sent to a control circuit of the second port that is to make access simultaneously, to thereby cause a delay in the control of the second port so that the access transistor for the second port be prevented from being activated simultaneously. In other words, the output timing of the activation signal is controlled.

Also, access may be made from the first port to a memory cell of a given row address while access from the second port to the same row address is underway. In such a case, data processing for the access from the first port is ensured in the following manner. That is, a signal based on a control signal output from the control circuit of the second port for memory access is also sent to the control circuit of the first port, to thereby perform delay control so that an adequate time for data processing can be secured as the data processing time for the access from the first port.

Specifically, the semiconductor memory device of the present invention is a semiconductor memory device having a plurality of memory cells accessible from a plurality of ports, including: first access transistors for electrically connecting bit lines of a first port among the plurality of ports to the memory cells in response to a first activation signal; second access transistors for electrically connecting bit lines of a second port among the plurality of ports to the memory cells in response to a second activation signal, the first access transistors and the second access transistors being connected to respective same nodes of the memory cells; a first row decoder for sending the first activation signal to the first access transistors via first word lines; a second row decoder for sending the second activation signal to the second access transistors via second word lines; a first control circuit for outputting a first control signal based on a first external control signal supplied externally to control the output of the first activation signal from the first row decoder with the first control signal; and a second control circuit for outputting a second control signal based on a second external control signal supplied externally to control the output of the second activation signal from the second row decoder with the second control signal, wherein when the memory cells receive access from the first port, the second control circuit delays the second control signal in response to the first control signal output from the first control circuit or a signal based on the first control signal, to delay the second activation signal output from the second row decoder to the second access transistors behind the output of the first activation signal by a predetermined time.

In one embodiment of the invention, the first port, the first access transistor, the first row decoder, the first activation signal, the first word lines, the first external control signal and the first control circuit are respectively a read port, a read access transistor, a read row decoder, a read activation signal, read work lines, external read control signals and a read control circuit, and the second port, the second access transistor, the second row decoder, the second activation signal, the second word lines, the second external control signal and the second control circuit are respectively a write port, a write access transistor, a write row decoder, a write activation signal, write work lines, external write control signals and a write control circuit.

In another embodiment of the invention, the device further includes: a read precharge circuit for precharging the bit lines of the read port; and a read precharge control circuit for supplying a read precharge signal to the read precharge circuit to control the precharge, wherein when access to the memory cells is made from the read port, the write control circuit delays its output signal generated based on the external write control signals, in response to the read enable signal output from the read control circuit and the read precharge signal output from the read precharge control circuit, to delay the write activation signal output from the write row decoder to the write access transistors behind the output of the read activation signal by a predetermined time.

In yet another embodiment of the invention, the device further includes a sense amplifier for amplifying data read from the memory cells, wherein when access to the memory cells is made from the read port, the write control circuit delays its output signal generated based on the external write control signals, in response to the read enable signal output from the read control circuit and a sense amplifier startup signal output from the read control circuit for starting the sense amplifier, to delay the write activation signal output from the write row decoder to the write access transistors behind the output of the read activation signal by a predetermined time.

In yet another embodiment of the invention, the read row decoder sends the read activation signal to the read access transistors based on a read word line startup signal output from the read control circuit, and when access to the memory cells is made from the read port, the write control circuit delays its output signal generated based on the external write control signals, in response to the read enable signal and the read word line startup signal output from the read control circuit, to delay the write activation signal output from the write row decoder to the write access transistor behind the output of the read activation signal by a predetermined time.

In yet another embodiment of the invention, the device further includes a sense amplifier for amplifying data read from the memory cells, and the sense amplifier includes a sensing confirmation signal generation circuit for outputting a sensing confirmation signal once sense amplification is performed, wherein when access to the memory cells is made from the read port, the write control circuit delays its output signal generated based on the external write control signals, in response to the read enable signal output from the read control circuit and the sensing confirmation signal output from the sensing confirmation signal generation circuit, to delay the write activation signal output from the write row decoder to the write access transistor behind the output of the read activation signal by a predetermined time.

In yet another embodiment of the invention, the sense amplifier located closest to the write control circuit includes the sensing confirmation signal generation circuit.

In yet another embodiment of the invention, the device further includes an address comparison circuit for comparing row addresses from the plurality of ports with each other and outputting the comparison result of a match or a mismatch of the row addresses to the write control circuit, wherein the write control circuit controls the time from the input of the external write control signals until the output of the write activation signal based on the comparison result from the address comparison circuit.

In yet another embodiment of the invention, the row decoder of one of the write port and the read port is connected with the word lines of the other port for the same row addresses, and the word lines of the one port for the same row addresses are activated only when the relevant word lines of the other port are inactive.

In yet another embodiment of the invention, the device further includes a write address latch for receiving a write address signal supplied externally and outputting write row address information and write column address information based on the write address signal under the control of the write control circuit, wherein an external input signal delay circuit is provided, on the external-input side of the write control circuit and the write address latch, for delaying the external write control signals so that the external write control signals be input into the write control circuit and the write address latch behind the timing of input of the read enable signal output from the read control circuit into the write control circuit.

Alternatively, the semiconductor memory device of the present invention is a semiconductor memory device having a plurality of memory cells accessible from a plurality of ports, including: first access transistors for electrically connecting bit lines of a first port among the plurality of ports to the memory cells in response to a first activation signal; second access transistors for electrically connecting bit lines of a second port among the plurality of ports to the memory cells in response to a second activation signal, the first access transistors and the second access transistors being connected to respective same nodes of the memory cells; a first row decoder for supplying the first activation signal to the first access transistors via first word lines; a second row decoder for supplying the second activation signal to the second access transistors via second word lines; a first control circuit for controlling the output of the first activation signal via the first row decoder based on first external control signal supplied externally; a second control circuit for controlling the output of the second activation signal via the second row decoder based on second external control signal supplied externally; and a control operation delay circuit, provided in the first control circuit, for increasing the output time period of the first activation signal in response to a signal based on the second external control signal if access to the memory cells is made from the first port during the time period when access to the memory cells from the second port is underway.

In one embodiment of the invention, the first port, the first access transistor, the first row decoder, the first activation signal, the first word lines, the first external control signal and the first control circuit are respectively a read port, a read access transistor, a read row decoder, a read activation signal, read work lines, external read control signals and a read control circuit, and the second port, the second access transistor, the second row decoder, the second activation signal, the second word lines, the second external control signal and the second control circuit are respectively a write port, a write access transistor, a write row decoder, a write activation signal, write work lines, external write control signals and a write control circuit.

In another embodiment of the invention, the device further includes: a write address latch for latching address data for one period; and a write input data latch for latching input data for one period.

In yet another embodiment of the invention, the read control circuit outputs a read enable signal when receiving the external read control signals externally, and also outputs a read word line startup signal as a signal based on the operation of the read row decoder outputting the read activation signal to the read word lines, and the read enable signal is OR-operated with the read word line startup signal to provide a second read enable signal, and the second read enable signal is input into the write control circuit.

In yet another embodiment of the invention, the external write control signals include a write clock signal for clock control of write operation, and the write clock signal is input into the write control circuit via an external input signal delay circuit son that the write clock signal be delayed behind the timing of input of the read enable signal output from the read control circuit into the write control circuit.

As described above, in the semiconductor memory device of the present invention, in the case of access to the same memory cell from both the first port and the second port, the second control circuit delays the start of the access from the second port by a predetermined time based on a signal output from the first control circuit of the first port, to allow the access from the first port to be made first. Therefore, even when the first port is a read port and the first and second ports respectively receive first and second external control signals for access within the same cycle, no increase in the load of bit lines will occur, and the intended read operation can be completed reliably at high speed.

According to one embodiment of the invention, in the case of access to the same memory cell from both the read port and the write port, the write control circuit delays the write operation by a predetermined time based on a signal output from the read control circuit, to allow execution of the read operation. Therefore, since the write word line is not activated during the read operation, the read operation can be performed reliably without addition of the load of the write bit lines, and thus the read time can be sped up.

According to another embodiment of the invention, the write control circuit delays the write operation by a predetermined time based on the read enable signal output from the read control circuit and the precharge signal. Therefore, the write operation can be started simultaneously with start of precharging of the read bit lines, and thus the frequency characteristics can be improved while the sped-up read time is maintained.

According to yet another embodiment of the invention, the write control circuit delays the write operation by a predetermined time based on the read enable signal and the sense amplifier startup signal for starting the sense amplifier, both output from the read control circuit. Therefore, since the write operation can be started simultaneously with the boot-up of the sense amplifier, the write operation can be performed without being affected by the read operation while the sped-up read time is maintained.

According to yet another embodiment of the invention, the write control circuit delays the write operation by a predetermined time based on the read enable signal and the read word line startup signal output from the read control circuit. Therefore, the write start time can be advanced while the sped-up read time is maintained, and thus the frequency characteristics can be improved.

According to yet another embodiment of the invention, the write control circuit delays the write operation by a predetermined time based on the read enable signal output from the read control circuit and the sensing confirmation signal output from the sensing confirmation signal generation circuit. Therefore, the write operation can be started without the necessity of waiting for the read word lines becoming inactive while the sped-up read time is maintained, and thus the frequency characteristics can be improved.

According to yet another embodiment of the invention, the sensing confirmation signal generation circuit is provided in the sense amplifier located closest to the write control circuit. Therefore, by using the sensing confirmation signal to delay the write operation by a predetermined time, the length of routing of lines and the like can be shortened, and thus the layout area can be reduced.

According to yet another embodiment of the invention, row addresses for accessing a memory cell from different ports are compared with each other to detect a match of the row addresses. Therefore, the write operation can be delayed only in the case of access to the same row address, and thus for access other than the access to the same row address, the frequency characteristics can be improved.

According to yet another embodiment of the invention, one row decoder is provided with an element for detecting the inactive state of word lines of the other row decoder by connecting the word lines of the other row decoder for the same row addresses to the wiring region of the one row decoder. Therefore, the write operation can be delayed only in the case of access to the same row address without increasing the area.

According to yet another embodiment of the invention, the external write control signals are input into the write control circuit via the external input signal delay circuit. Therefore, adjustment is made so that the external write control signals be input into the write control circuit after the input of the read enable signal considering the delay of the input of the read enable signal. This can prevent missing of simultaneous access from two ports.

According to yet another embodiment of the invention, if the first port attempts to access a memory cell when access to the same memory cell from the second port is underway, the control circuit of the second port outputs a signal based on the second external control signal indicating that access is underway to the first control circuit, to operate the control operation delay circuit in the first control circuit, to thereby increase the output time period of the first activation signal. Therefore, even if access from the first port is started immediately after termination of the access from the second port, and the first port is a read port, processing of read data can be secured.

According to yet another embodiment of the invention, if the first port attempts to access a memory cell when access to the same memory cell from the write port is underway, the write control circuit outputs a signal indicating that the access is underway to the second delay circuit, to increase the output time period of the read activation signal. Therefore, even if read is started immediately after write, read of data can be secured.

According to yet another embodiment of the invention, address data and input data of one period can be latched with the address latch and the input data latch in the write port. Therefore, write can be made even in the latter half of one period, and moreover the frequency characteristics can be improved.

According to yet another embodiment of the invention, the OR result of the read enable signal and the read word line startup signal is used as the second read enable signal in place of the read enable signal. Therefore, write will not be started until termination of read even if the read is started in the latter half of one period, to thereby prevent selection of the write word line of the same row address.

DESCRIPTION OF THE PREFERRED EMBODIMENTS

Figure 1:
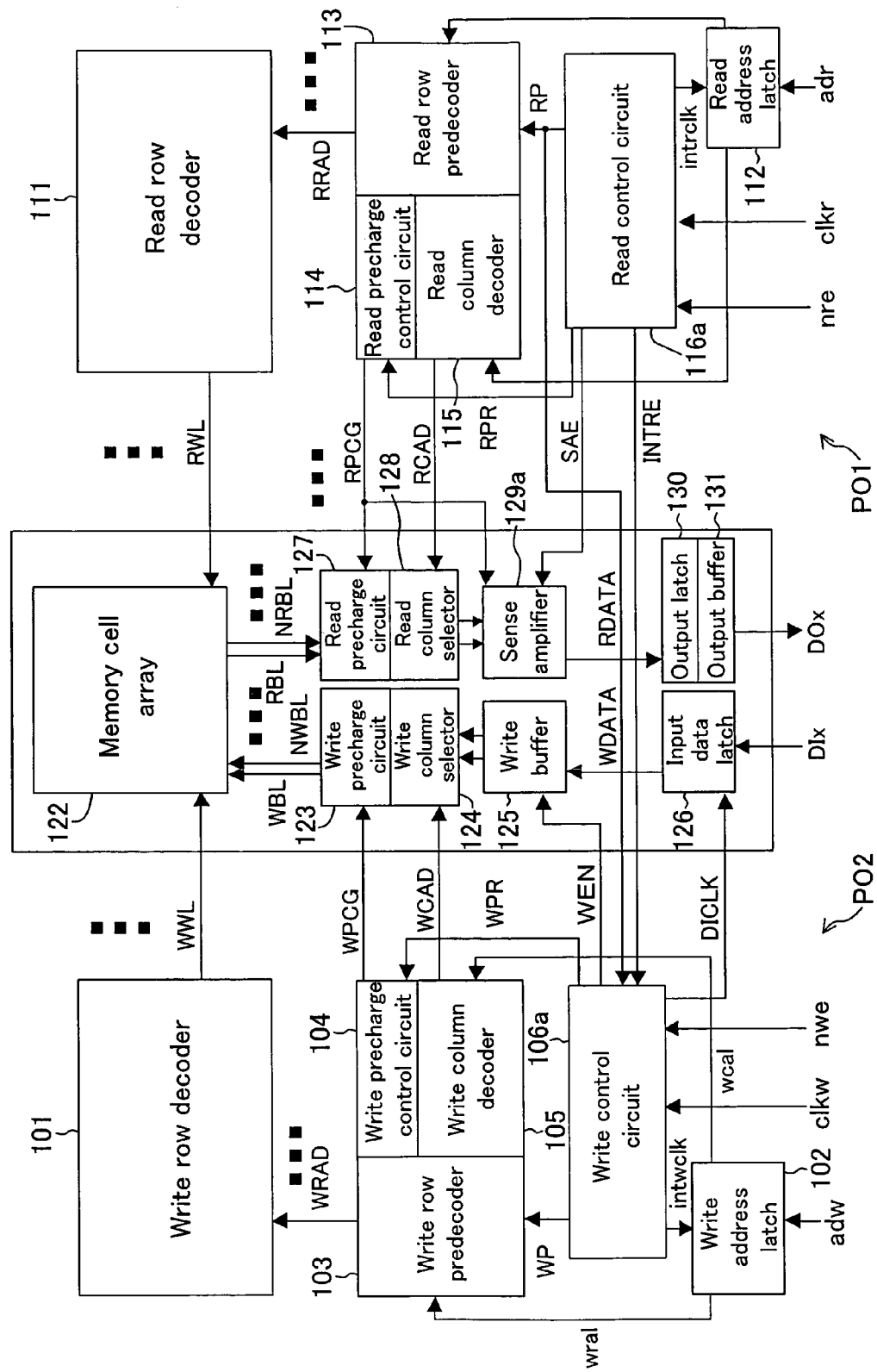
FIG. 1 is a block diagram of a dual-port memory of Embodiment 1 of the present invention.

Hereinafter, preferred embodiments of the present invention will be described with reference to the accompanying drawings.

Throughout the drawings for illustrating the embodiments of the present invention, like components are denoted by the same reference numerals, and description thereof is not repeated. Note that although a dual-port memory having a dedicated read port and a dedicated write port will be herein described, the present invention is also applicable to memory devices having three or more dedicated ports and memory devices having two or more ports permitting read/write. It is also noted that the numbers of word lines and bit lines in a memory array and the number of data I/Os are not limited to those described in the embodiments to follow.

Embodiment 1

FIG. 1 shows the entire configuration of a semiconductor memory device of Embodiment 1 of the present invention.

The dual-port memory shown in FIG. 1 is a predecode type memory, in which a memory cell array 122 is connected with a write row decoder 101 via write word lines WWL, connected with a read row decoder 111 via read word lines RWL, connected with a write precharge circuit 123 via write bit line pairs WBL/NWBL, and connected with a read precharge circuit 127 via read bit line pairs RBL/NRBL.

The write row decoder 101 receives write row predecode signals WRAD from a write row predecoder 103. The write row predecoder 103 receives a write row address latch signal (write row address information) wral from a write address latch 102 and a write word line pulse signal WP from a write control circuit 106a. The read row decoder 111 receives read row predecode signals RRAD from a read row predecoder 113. The read row predecoder 113 receives a read row address latch signal from a read address latch 112 and a read word line pulse signal RP from a read control circuit 116a.

The write precharge circuit 123 receives a write precharge signal WPCG from a write precharge control circuit 104. The write precharge circuit 123 and a write column selector 124 are connected to each other via the write bit line pairs WBL/NWBL. The read precharge circuit 127 receives a read precharge signal RPCG from a read precharge control circuit 114. The read precharge circuit 127 and a read column selector 128 are connected to each other via the read bit line pairs RBL/NRBL.

The write column selector 124 is connected with a write buffer 125 via write data lines, and receives a write column decode signal WCAD from a write column decoder 105. The read column selector 128 is connected with a sense amplifier 129a via read data lines, and receives a read column decode signal RCAD from a read column decoder 115.

The write column decoder 105 receives a write column address latch signal (write column address information) wcal from the write address latch 102, and the read column decoder 115 receives a read column address latch signal from the read address latch 112. The write buffer 125 receives an input data latch signal WDATA from an input data latch 126, and also receives a write buffer startup signal WEN from the write control circuit 106a.

The sense amplifier 129a outputs a sense amplifier signal RDATA to an output latch 130, and receives a sense amplifier startup signal SAE from the read control circuit 116a. The output latch 130 outputs an output data latch signal to an output buffer 131.

The input data latch 126 receives a data latch startup signal DICLK from the write control circuit 106a, and also receives external input data DIx from outside.

The output buffer 131 outputs data DOx externally.

The write precharge control circuit 104 receives a write precharge startup signal WPR from the write control circuit 106a, and the read precharge control circuit 114 receives a read precharge startup signal RPR from the read control circuit 116a The write address latch 102 receives a write address latch startup signal intwclk from the write control circuit 106a, and the read address latch 112 receives a read address latch startup signal intrclk from the read control circuit 116a. The write control circuit 106a receives a read enable signal INTRE and the read word line pulse signal RP from the read control circuit 116a.

The part of the peripheral circuits of the memory cell array 122 related to read processing, composed of the read row decoder 111, the read address latch 112, the read row predecoder 113, the read precharge control circuit 114, the read column decoder 115, the read control circuit 116a, the read precharge circuit 127, the read column selector 128, the sense amplifier 129a, the output latch 130 and the output buffer 131, constitutes a read port PO1 (first port). Likewise, the part of the peripheral circuits of the memory cell array 122 related to write processing, composed of the write row decoder 101, the write address latch 102, the write row predecoder 103, the write precharge control circuit 104, the write column decoder 105, the write control circuit 106a, the write precharge circuit 123, the write column selector 124, the write buffer 125 and the input data latch 126, constitutes a write port PO2 (second port).

A feature of the present invention in this embodiment is that the write control circuit 106a of the write port PO2 can receive the read word line pulse signal RP output from the read control circuit 116a of the read port PO1 roughly simultaneously with the reception of this signal by the read row predecoder 113.

Figure 2:
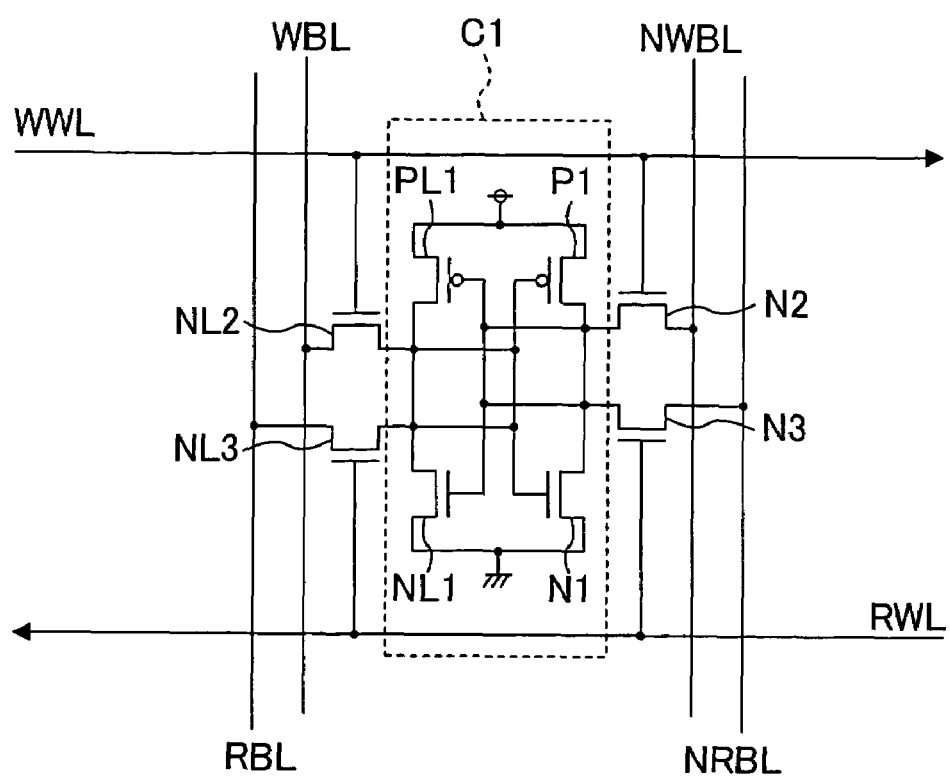
FIG. 2 is a detailed view of a dual-port memory cell.

FIG. 2 shows a dual-port memory cell C1 as one of the memory cells arranged in a matrix in the memory cell array 122 in FIG. 1 together with lines connected thereto. Access transistors NL2, NL3, N2 and N3 are provided to switch the access to the memory cell C1 between access from the read port PO1 and access from the write port PO2. The access transistors NL2, NL3, N2 and N3 respectively receive an activation signal from the write word line WWL or the read word line RWL connected to their gates, to electrically connect the write bit line pair WBL/NWBL or the read bit line pair RBL/NRBL to the memory cell C1.

Likewise, each of the memory cells C1 arranged in a matrix in the memory cell array 122 is connected with one pair among a plurality of write bit line pairs WBL0/NWBL0 to WBLn/NWBLn, one pair among a plurality of read bit line pairs RBL0/NRBL0 to RBLn/NRBLn, one among a plurality of write word lines WWL0 to WWLn, and one among a plurality of read word lines RWL0 to RWLn, although not shown in FIG. 2.

In accessing from the write port (second port) PO2 for write to the memory cell C1 shown in FIG. 2, which includes PMOS transistors P1 and PL1 and NMOS transistors N1 and NL1, the write row decoder (second row decoder) 101 in FIG. 1 sends an activation signal (second activation signal) to the memory cell C1 via the write word line (second word line) WWL. The activation signal is input into the gates of the NMOS transistors N2 and NL2 (second access transistors) for enabling drain-source connection between the write bit line pair WBL/NWBL (bit lines for the second port) and the memory cell C1, to thereby electrically connect the write bit line pair WBL/NWBL with the memory cell C1.

In accessing of the read port (first port) PO1 for read to the memory cell C1, the read row decoder (first row decoder) 111 in FIG. 1 sends an activation signal (first activation signal) to the memory cell C1 via the read word line (first word line) RWL. The activation signal is input into the gates of the NMOS transistors N3 and NL3 (first access transistors) for enabling drain-source connection between the read bit line pair RBL/NRBL (bit lines for the first port) and the memory cell C1, to thereby electrically connect the read bit line pair RBL/NRBL with the memory cell C1.

The NMOS transistor NL2 connected to the write bit line WBL and the NMOS transistor NL3 connected to the read bit line RBL are connected at the same node (drain of the PMOS transistor PL1) in the memory cell C1. Likewise, the NMOS transistor N2 connected to the write bit line NWBL and the NMOS transistor N3 connected to the read bit line NRBL are connected at the same node (drain of the PMOS transistor P1) in the memory cell C1.

Figure 3:
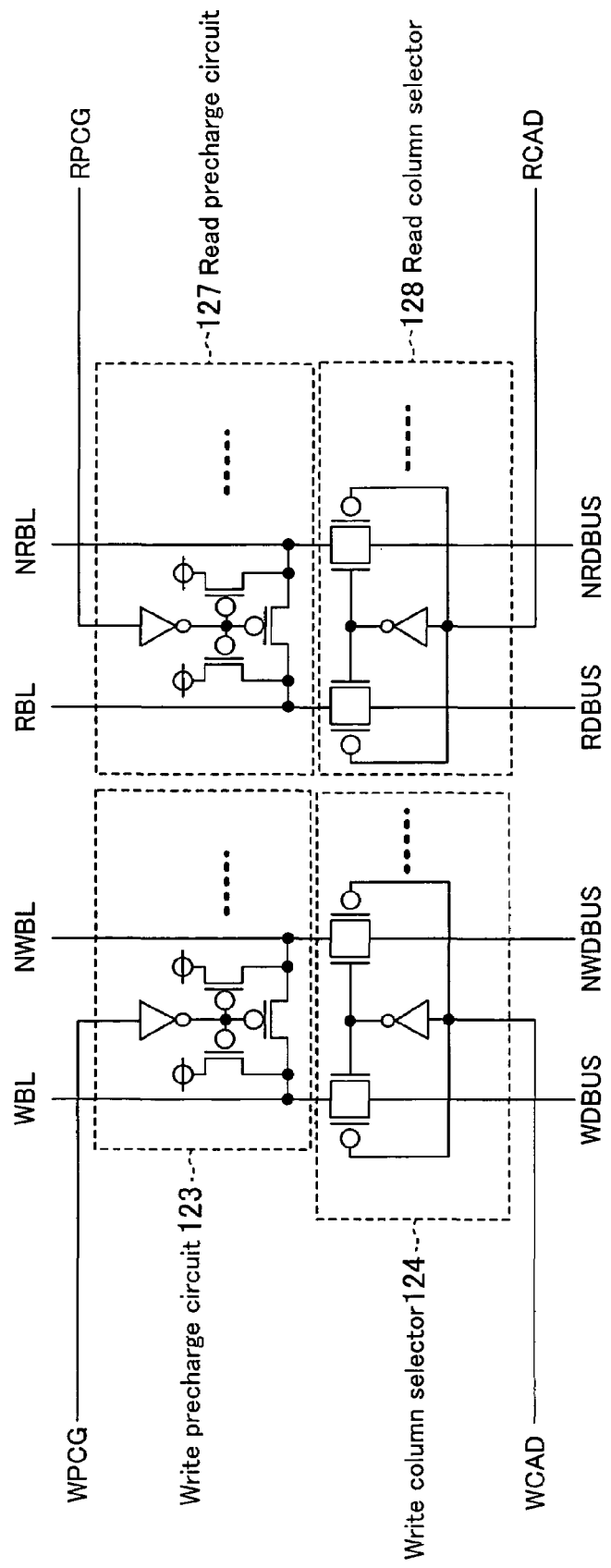
FIG. 3 is a detailed view of precharges and column selectors.

FIG. 3 shows details of the write precharge circuit 123, the write column selector 124, the read precharge circuit 127 and the read column selector 128 in FIG. 1. The write precharge circuit 123 and the read precharge circuit 127, which are respectively composed of three PMOS transistors and one inverter in this embodiment, precharge the write bit line pair WBL/NWBL and the read bit line pair RBL/NRBL in response to the write precharge signal WPCG and the read precharge signal RPCG, respectively.

The write column selector 124 and the read column selector 128 are respectively composed of two transmission gates and one inverter. The write column selector 124 connects the write bit line pair WBL/NWBL with the write buffer 125 in response to the write column decode signal WCAD, and the read column selector 128 connects the read bit line pair RBL/NRBL with the sense amplifier 129a in response to the read column decode signal RCAD.

Figure 4:
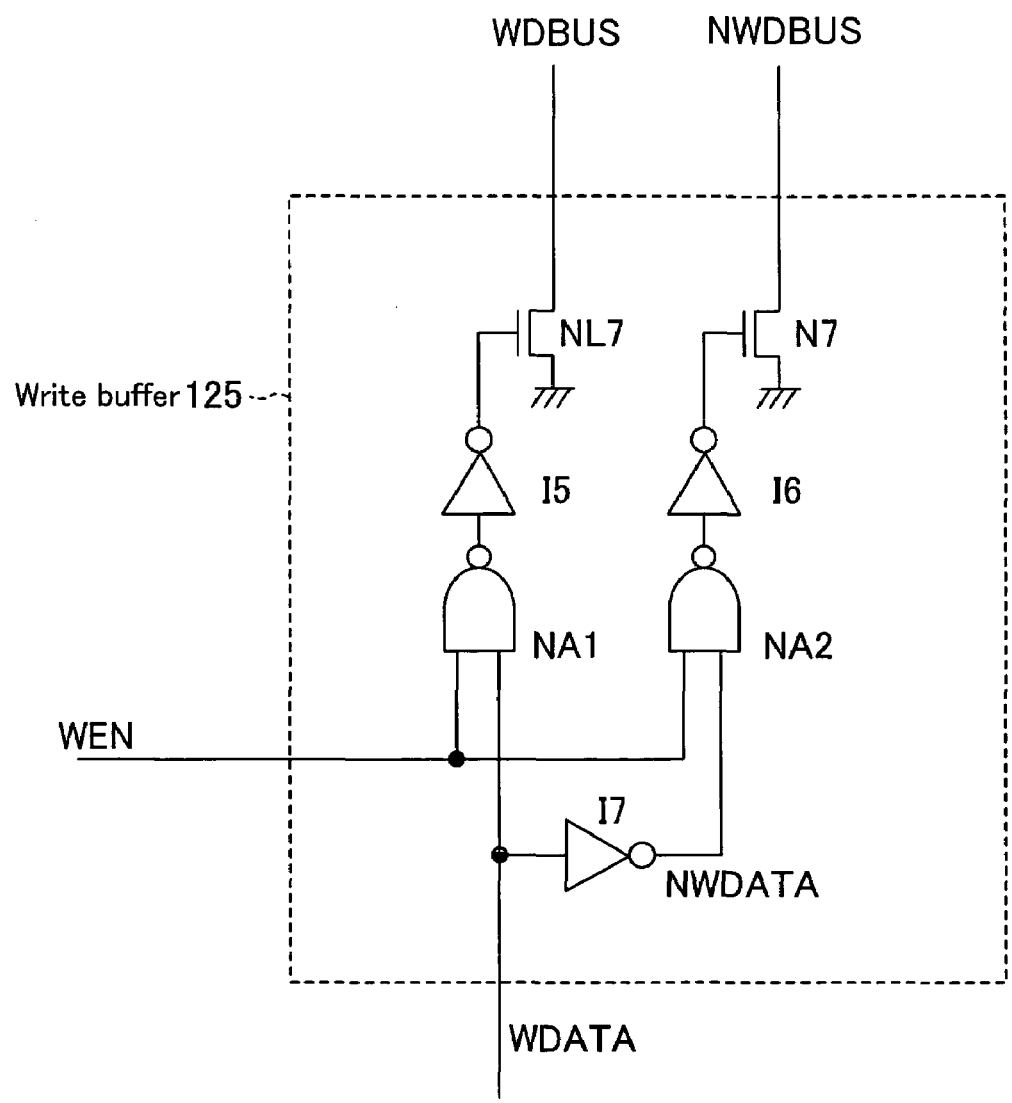
FIG. 4 is a detailed view of a write buffer.

FIG. 4 shows details of the write buffer 125 in FIG. 1. The write buffer 125, which is composed of two NMOS transistors NL7 and N7, two NAND circuits NA1 and NA2 and three inverters 15, 16 and 17 in this embodiment, outputs the received input data latch signal WDATA to the write column selector 124 under the control of the write buffer startup signal WEN.

Figure 5:
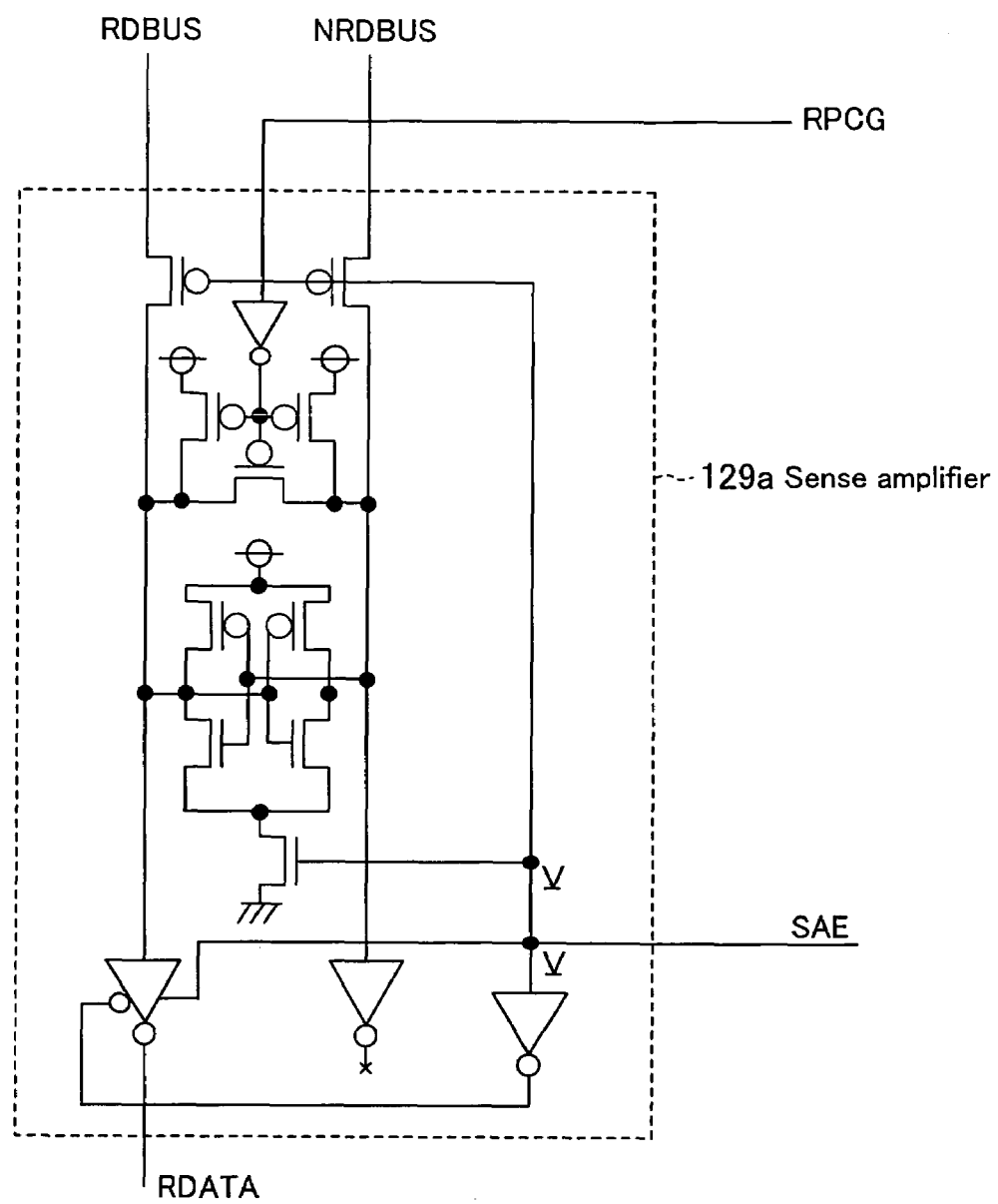
FIG. 5 is a detailed view of a sense amplifier.

FIG. 5 shows details of the sense amplifier 129a in FIG. 1. The sense amplifier 129a in this embodiment, which receives the read precharge signal RPCG from the read precharge control circuit 114 and also the sense amplifier startup signal SAE from the read control circuit 116a, amplifies the signal received from the read column selector 128 and then outputs the amplified data as the sense amplifier signal RDATA.

Figure 6:
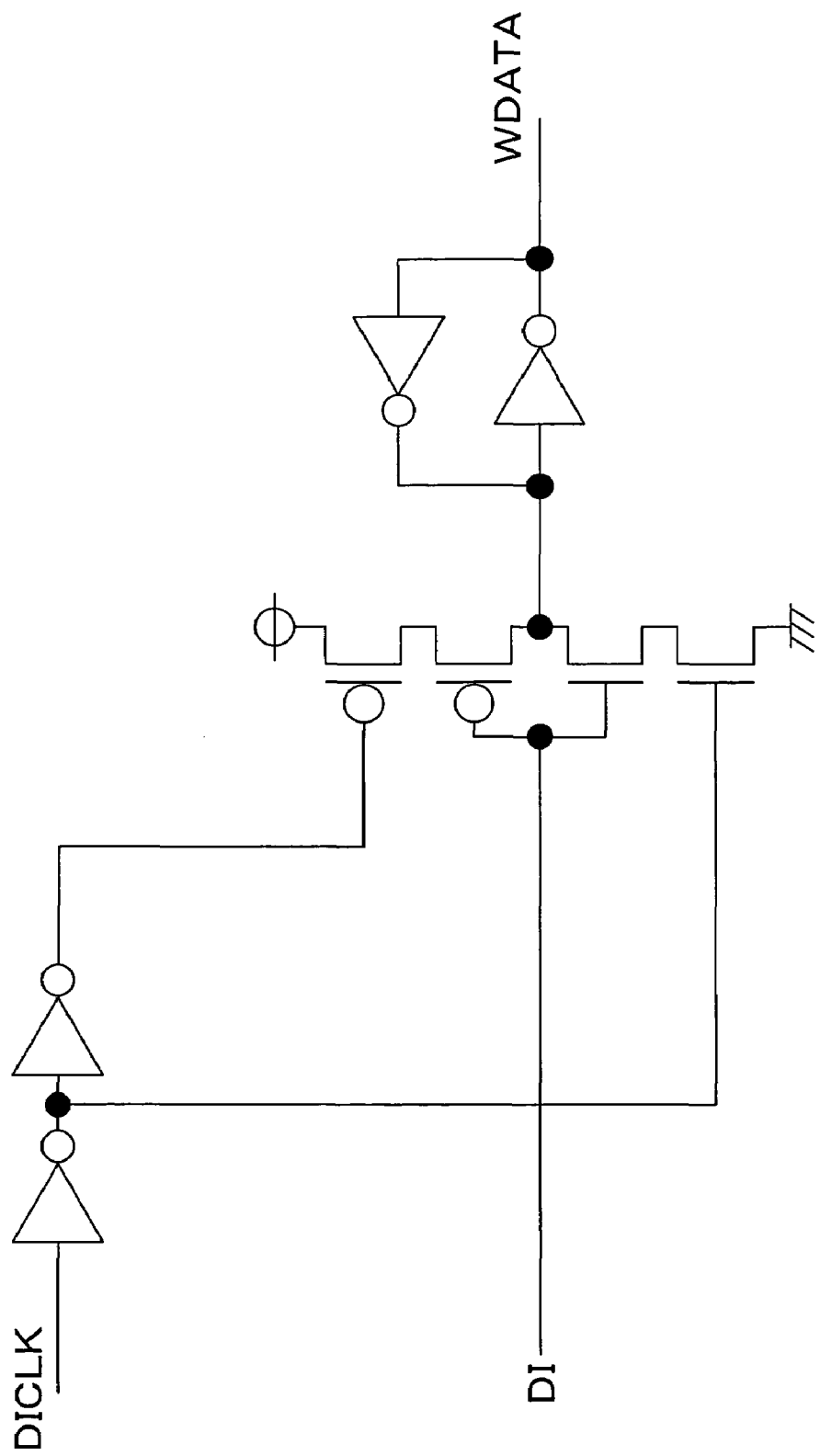
FIG. 6 is a detailed view of an input data latch or an address latch.

FIG. 6 shows details of the input data latch 126 in FIG. 1. In this embodiment, this configuration of the latch also applies to the write address latch 102 and the read address latch 112 in FIG. 1. The input data latch 126 receives the input data DI and outputs the input data latch signal WDATA under the control of the data latch startup signal DICLK.

Figure 7:
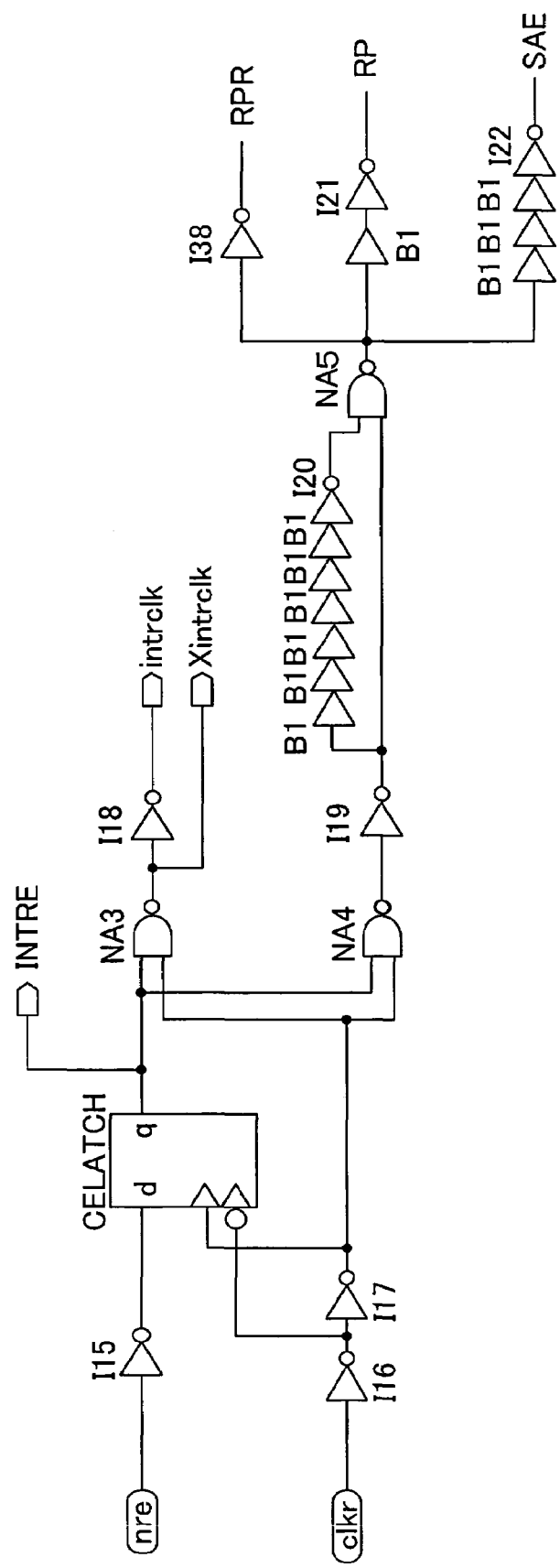
FIG. 7 is a detailed view of a read control circuit in Embodiment 1.

FIG. 7 shows details of the read control circuit (first control circuit) 116a in FIG. 1, which receives an external read enable signal nre and a read clock clkr, among external signals (first external control signals) supplied externally to the semiconductor memory device. The external read enable signal nre is latched by a latch circuit CELATCH via an inverter I15, and the read enable signal INTRE is output from the latch circuit CELATCH. The output of the latch circuit CELATCH is also input into a 2-input NAND circuit NA4 together with the read clock clkr sent via two inverters I16 and I17. The output of the NAND circuit NA4 passes through an inverter I19 and then branched into two, both of which are then input into a 2-input NAND circuit NA5 via six buffers B1 and an inverter I20 for one and directly for the other. The output of the NAND circuit NA5 is branched into three, one of which is output as the read precharge startup signal RPR via an inverter I38, another one is output as the read word line pulse signal RP via a buffer B1 and an inverter I21, and the remaining one is output as the sense amplifier startup signal SAE via three buffers B1 and an inverter I22.

The output read word line pulse signal RP is input into the read row predecoder 113, as described above with reference to FIG. 1. The read row predecode signal RRAD is then output from the read row predecoder 113 to the read row decoder 111 to control the read row decoder 111. Under this control, the read row decoder 111 outputs the activation signal to the memory cell array 122 via the read word lines RWL. Also, as described above with reference to FIG. 1, the read word line pulse signal RP (first control signal) is also input into the write control circuit 106a, not only into the read row predecoder 113. The internal configuration of the write control circuit 106a receiving the read word line pulse signal RP will then be described with reference to FIG. 8.

Figure 8:
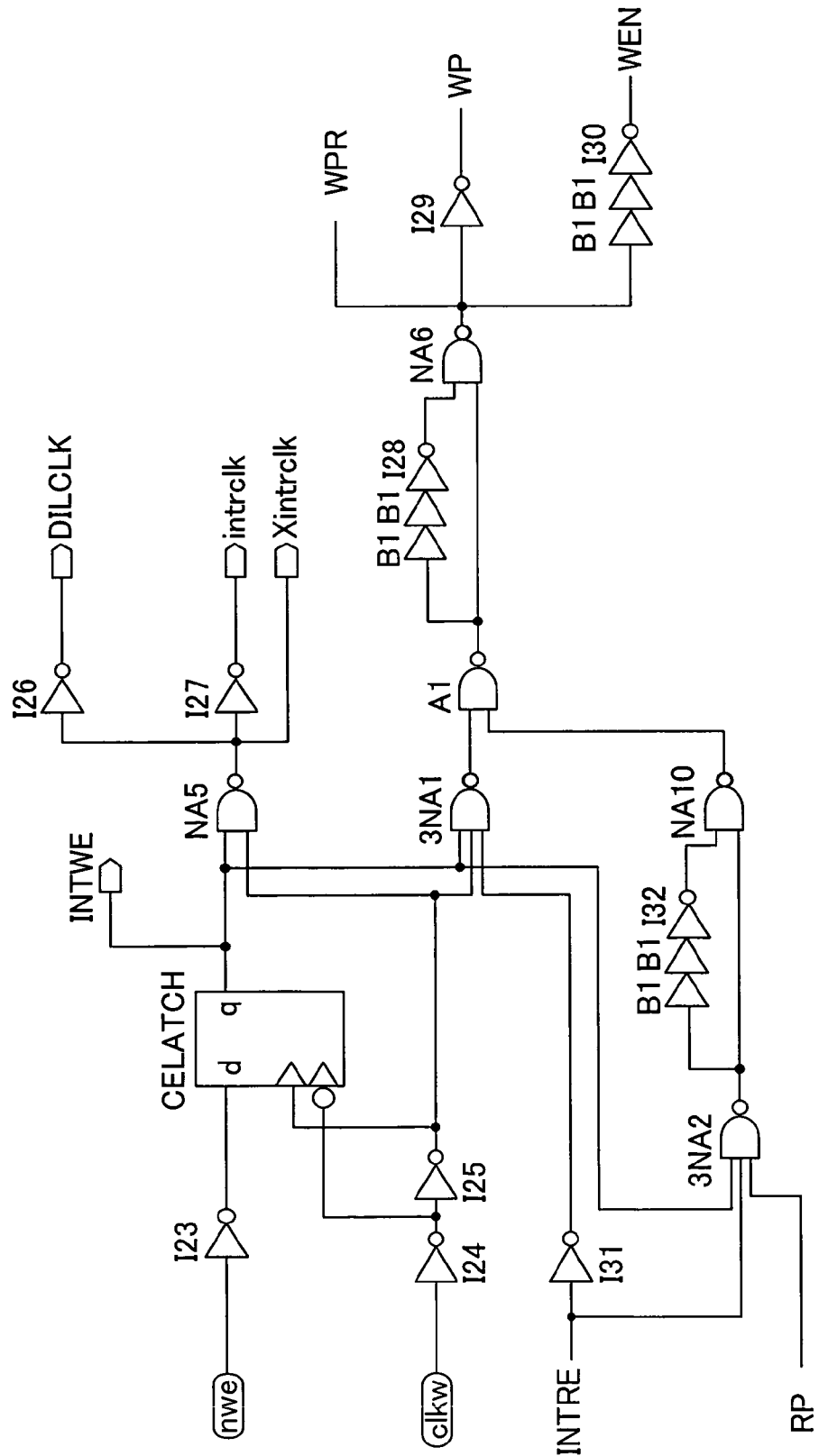
FIG. 8 is a detailed view of a write control circuit in Embodiment 1.

FIG. 8 shows the write control circuit (second control circuit) 106a in FIG. 1, which receives an external write enable signal nwe and a write clock clkw, among external signals (second external control signals), the read enable signal INTRE output from the read control circuit 116a and the read word line pulse signal RP described above, and outputs a write enable signal INTWE, the write precharge startup signal WPR, the write word line pulse signal WP and the write buffer startup signal WEN. The write enable signal INTWE is a signal obtained by allowing the external write enable signal nwe to pass through an inverter I23 and a latch circuit CELATCH. The output of the latch circuit CELATCH is also input into a 3-input NAND circuit 3NA1 together with the write clock clkw sent via two inverters I24 and I25 and the read enable signal INTRE sent via an inverter I31. The output of the NAND circuit 3NA1 is input into one terminal of a 2-input NAND circuit A1.

The signal input into the other terminal of the 2-input AND circuit A1 will be described. The output of the CELATCH (write enable signal INTWE), the read enable signal INTRE and the read word line pulse signal RP are input into a 3-input NAND circuit 3NA2. The output of the 3-input NAND circuit 3NA2 is branched into two, both of which are then input into a 2-input NAND circuit NA10 via a serial circuit composed of two buffers B1 and an inverter I32 for one and directly for the other. The output of the 2-input NAND circuit NA10 is then input into the other input terminal of the 2-input NAND circuit A1.

The output of the 2-input NAND circuit A1 is branched into two, both of which are then input into a 2-input NAND circuit NA6 via a serial circuit composed of two buffers B1 and an inverter 128 for one and directly for the other. The output of the NAND circuit NA6 is branched into three, one of which is output as the write precharge startup signal WPR as it is, another one is output as the write word line pulse signal WP via an inverter I29, and the remaining one is output as the write buffer startup signal WEN via two buffers B1 and an inverter I30.

The write word line pulse signal WP output from the write control circuit 106a based on the external signals is input into the write row predecoder 103, as described above with reference to FIG. 1. The write row predecode signal WRAD is then output from the write row predecoder 103 to the write row decoder 101. The write row decoder 101 outputs the activation signal to the memory cell array 122 via the write word lines WWL. In this manner, the write control circuit 106a controls the write row decoder 101.

The operation of the dual-port memory cell in this embodiment configured as described above will be described with reference to the views of the read control circuit of FIG. 7 and the write control circuit of FIG. 8 and the timing chart of FIG. 21.

Figure 21:
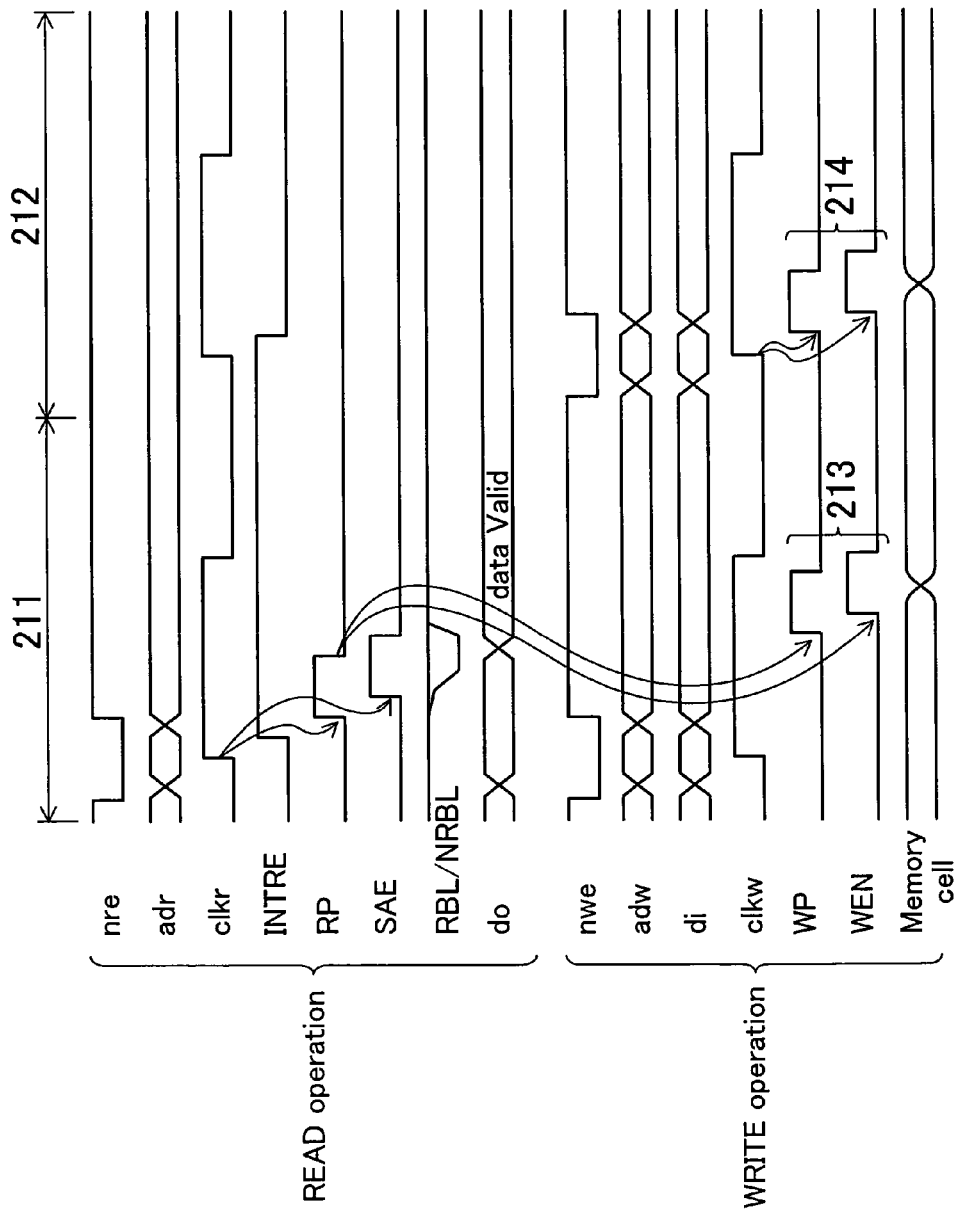
FIG. 21 is a timing chart showing READ operation and WRITE operation of the dual-port memory of the present invention.
Figure 22:
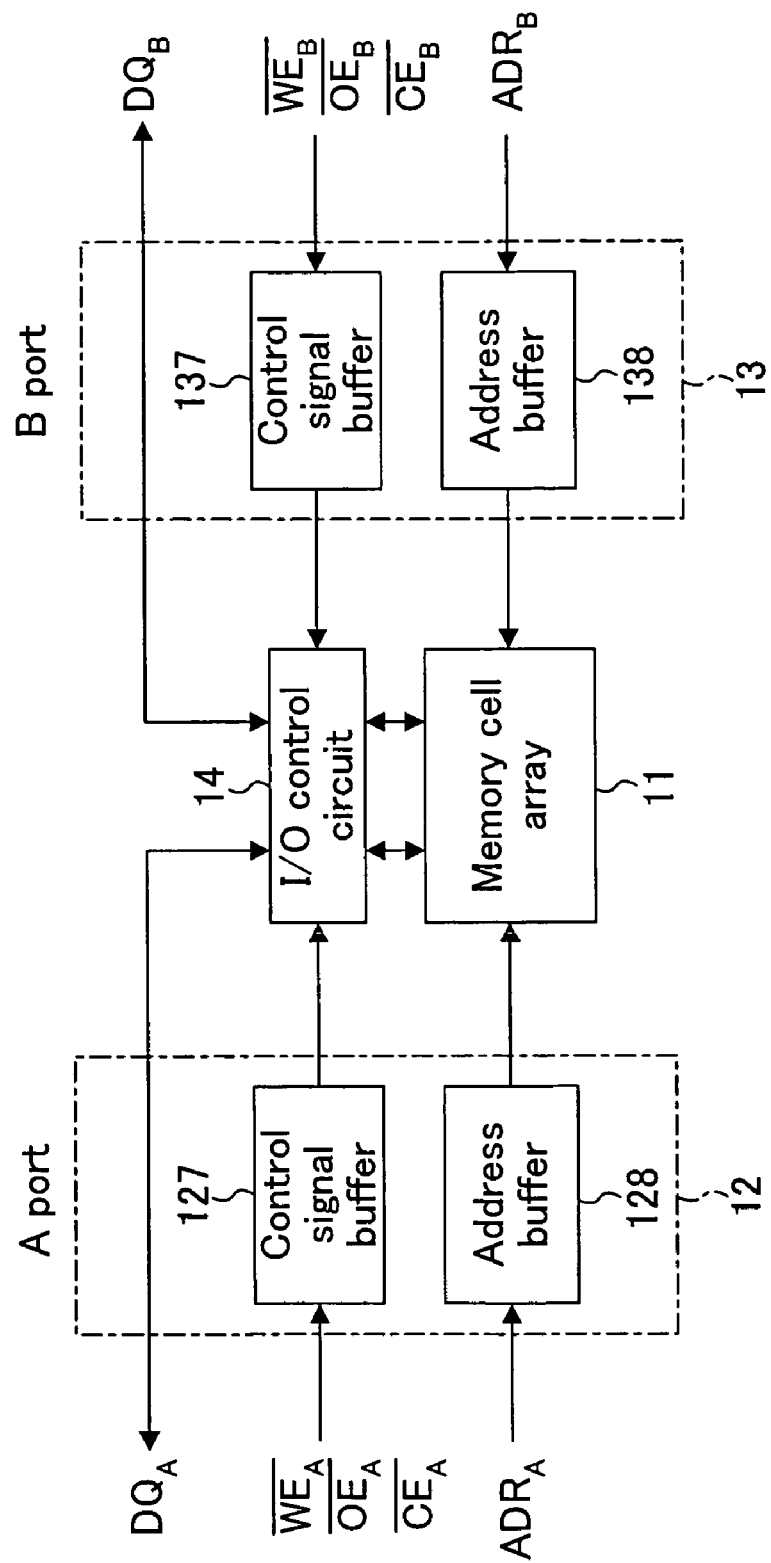
FIG. 22 is a block diagram of a conventional dual-port memory.

FIG. 21 is a timing chart of READ operation and WRITE operation, in which part 211 shows the case that READ operation is detected and part 212 shows the case that READ operation is not detected.

When the dual-port memory starts execution of read/write by receiving external signals from outside, the external read enable signal nre goes low ("L"), the read clock signal clkr goes high ("H"), the write enable signal nwe goes "L" and the write clock signal clkw goes "H". At this time, in the read control circuit 116a shown in FIG. 7, the read enable signal INTRE, as the latch output signal obtained by allowing the external read enable signal nre to pass through the inverter I15 and the latch circuit CELATCH, goes "H". Also, in the write control circuit 106a shown in FIG. 8, receiving the "H"-level read enable signal INTRE, the inverter I31 outputs "L" level, and the 3-input NAND circuit 3NA1 outputs "H" level. Note that since the write address latch startup signals intwclk/xintwclk and the data latch startup signal DICLK depend on only the external write enable signal nwe and the write clock clkw and thus are free from the control of the read enable signal INTRE, these signals are unaffected by read access from the read port PO1 if any.

FIG. 21 shows a series of operation, in which if the read word line pulse signal RP rises from "L" to "H" during the time period when the external write enable signal nwe is "L", the write clock signal clkw is "H", and the read enable signal INTRE is "H", the write word line pulse signal WP rises to "H" with a delay from the rise of the signal RP, and then the write buffer startup signal WEN rises to "H" with a further delay from the signal WP. This will be described with reference to FIG. 8. The output of the 3-input NAND 3NA2 depends on the read word line pulse signal RP when the external write enable signal nwe is "L", the write clock signal clkw is "H", and the read enable signal INTRE is "H", and therefore goes "L" from "H" if the read word line pulse signal RP changes from "L" to "H". However, despite of this change, the output of the 2-input NAND circuit NA10 remains "H". Accordingly, receiving the two "H"-level outputs from the 3-input NAND circuit 3NA1 and the 2-input NAND circuit NA10, the output of the 2-input NAND circuit A1 remains "L", and thus the output of the 2-input NAND circuit NA6 remains "H". At this time point, charge information from the memory cell is delivered to the read bit line pair RBL/NRBL. Subsequently, when the sense amplifier startup signal SAE output from the read control circuit 116a to the sense amplifier 129a goes "H", the data on the bit line pair RBL/NRBL is amplified with the sense amplifier 129a. The amplified sense amplifier signal RDATA is latched with the output latch 130, and the latched data is output externally via the output buffer 131 as the data DOx.

Next, if the read word line pulse signal RP changes from "H" to "L" during the time period when the external write enable signal nwe is "L", the write clock signal clkw is "H", and the read enable signal INTRE is "H", the output of the 3-input NAND 3NA2 changes from "L" to "H", and the 2-input NAND circuit NA10 outputs an "L" pulse for the time length of the delay given by the two buffers B1 and the inverter I32. Since the output of the 3-input NAND circuit 3NA1 is "H", the 2-input NAND circuit A1 receives "H" level at one terminal and the "L" pulse for the time length of the delay given by the two buffers B1 and the inverter I32 at the other terminal. The 2-input NAND circuit A1 therefore outputs an "H" pulse for the time length of the delay given by the two buffers B1 and the inverter I32, and further the 2-input NAND circuit NA6 outputs an "L" pulse for the time length of the delay given by the two buffers B1 and the inverter I28. Based on the output of the 2-input NAND circuit NA6, the write control circuit 106a sequentially generates an "L" pulse of the write precharge startup signal WPR, an "H" pulse of the write word line pulse signal WP and an "H" pulse of the write buffer startup signal WEN. These changes of the signals are illustrated as 213 in FIG. 21, in which in response to the fall of the read word line pulse signal RP from "H" to "L", the pulse of the write word line pulse signal WP rises with a delay by a predetermined time, and with a further delay from this rise, the pulse of the write buffer startup signal WEN rises.

The part 212 in FIG. 21 shows changes of the WRITE operation in the case that READ operation is not detected, in comparison with the case that READ operation is detected.

In the case that READ operation is not detected, that is, the read word line pulse signal RP is fixed at "L" level, the output of the 3-input NAND circuit 3NA2 of the write control circuit 106a shown in FIG. 8 is kept at a constant "H"-level value irrespective of the states of the other input signals. This also fixes the output of the 2-input NAND circuit NA10 at "H" level, and thus makes the output of the 2-input NAND circuit A1 dependent on the output of the 3-input NAND circuit 3NA1. At this time, if write is made while no read being made, that is, if the write clock signal clkw rises to "H" during the time period when the read enable signal INTRE is "L" and the external write enable signal nwe is "L", the output of the 3-input NAND circuit 3NA1 changes from "H" to "L". This raises the output of the 2-input NAND circuit A1 from "L" to "H", and then the 2-input NAND circuit NA6 outputs an "L" pulse for the time length of the delay given by the two buffers B1 and the inverter I28. Thus, an "H" pulse of the same delay time is sequentially generated as the write word line pulse signal WP and then as the write buffer startup signal WEN. These changes of the signals are illustrated as 214 in FIG. 21.

As described above, in Embodiment 1 of the present invention, the read word line pulse signal RP output from the read control circuit 116a based on the external read enable signal nre and the read clock signal clkr supplied externally is given to the write control circuit 106a. With the input of the signal RP, the output timing of the write word line pulse signal WP output from the write control circuit 106a based on the external write enable signal nwe and the write clock signal clkw supplied externally is delayed by a predetermined time, to thereby perform delay control of write.

In other words, the configuration is made so that the write word lines WWL are activated after activation of the read word lines RWL. In FIG. 2, data is read from the memory cell C1 to the read bit line pair RBL/NRBL via the NMOS transistors NL3 and N3 for read access. After the NMOS transistors NL3 and N3 are turned OFF, the NMOS transistors NL2 and N2 for write access are turned ON to allow write of new data. Therefore, the NMOS transistors NL3 and N3 and the NMOS transistors NL2 and N2 will not be ON simultaneously, and thus the write bit line pair WBL/NWBL will not become electrically continuous with the read bit line pair RBL/NRBL. Data can therefore be read from the read bit line pair RBL/NRBL reliably during activation of the read word line RWL disregarding the load of the write bit line pair WBL/NWBL, and in addition, the read time can be sped up. The practical effect is therefore great.

In the above description of this embodiment, the write control circuit 106a was controlled using the read word line pulse signal RP. Alternatively, although not illustrated, the write control circuit 106a may be controlled using the read precharge signal RPCG output from the read precharge control circuit 114 in a similar manner, to control the output timing of the write activation signal.

Embodiment 2

Figure 9:
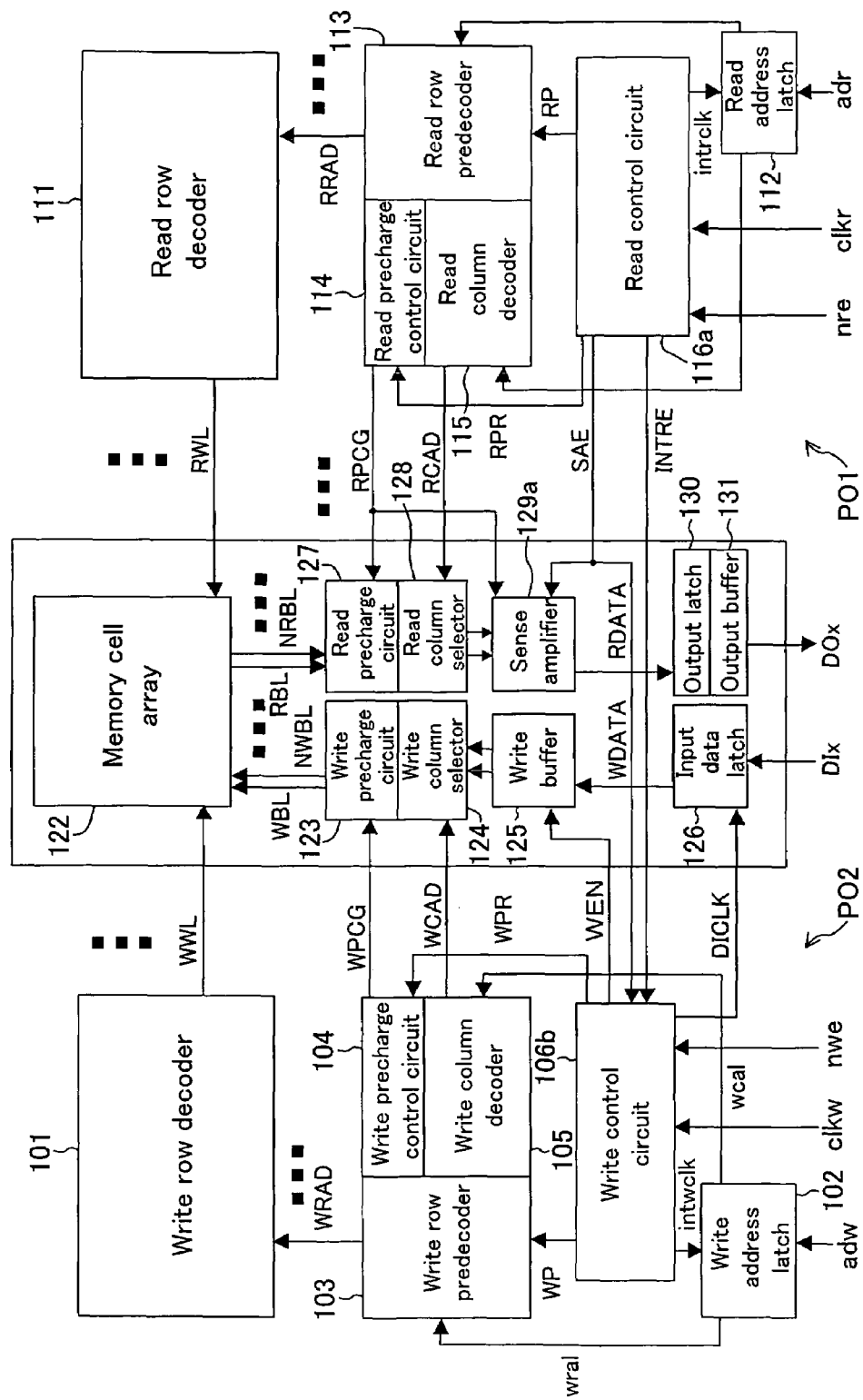
FIG. 9 is a block diagram of a dual-port memory of Embodiment 2 of the present invention.

Embodiment 2 of the present invention will be described with reference to the relevant drawings. FIG. 9 is a block diagram of a dual-port memory of Embodiment 2, which is different from the dual-port memory of FIG. 1 in that the sense amplifier startup signal SAE output from the read control circuit 116a to the sense amplifier 129a for starting the sense amplifier 129a is also sent to a write control circuit 106b, and that the output timing of the write activation signal is controlled with the signal SAE.

The write control circuit 106b in this embodiment is the same as the write control circuit 106a in Embodiment 1 shown in FIG. 8, except that the sense amplifier startup signal SAE is input in place of the read word line pulse signal RP.

In Embodiment 2 of the present invention, when receiving the sense amplifier startup signal (first control signal) SAE, the write control circuit 106b sequentially outputs the write precharge startup signal WPR ("L" pulse), the write word line pulse signal WP ("H" pulse) and the write buffer startup signal WEN ("H" pulse) each for the time length of the delay given by the two buffers B1 and the inverter I28, with a delay by a predetermined time from the time point of the input of the sense amplifier startup signal SAE into the sense amplifier 129a from the read control circuit 116a. Thus, since the write operation is started after termination of the operation of the sense amplifier, the write operation can be executed without being affected by the read operation. The practical effect is therefore great.

Figure 20:
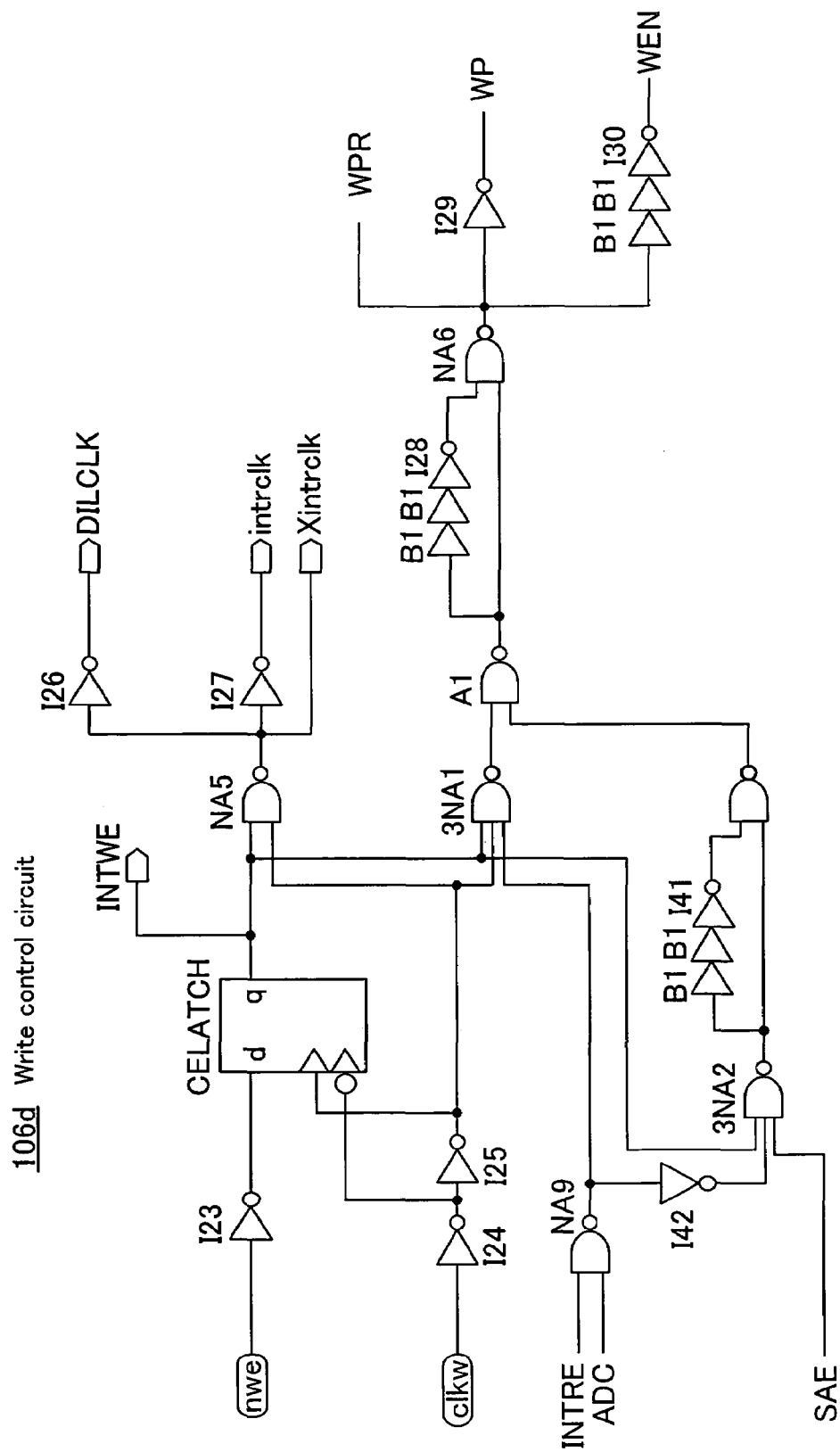
FIG. 20 is a detailed view of a write control circuit in Embodiment 8 of the present invention.

FIG. 20 shows the details of the write control circuit 106b, which is different from the write control circuit 106a in Embodiment 1 shown in FIG. 8 in that the sense amplifier startup signal SAE is input, in place of the read word line pulse signal RP, for one input terminal of the 2-input NAND circuit A1. The other configuration is the same as that in Embodiment 1.

In Embodiment 2 of the present invention, when receiving the sense amplifier startup signal SAE, the write control circuit 106b generates an "L" pulse of the write precharge startup signal WPR for the time length of the delay given by the two buffers B1 and the inverter I28, and sequentially generates an "H" pulse of the write word line pulse signal WP and the write buffer startup signal WEN for the same time length. Thus, since the write operation is started after termination of the operation of the sense amplifier, the read operation can be executed without being affected by the write operation. The practical effect is therefore great.

Embodiment 3

Figure 10:
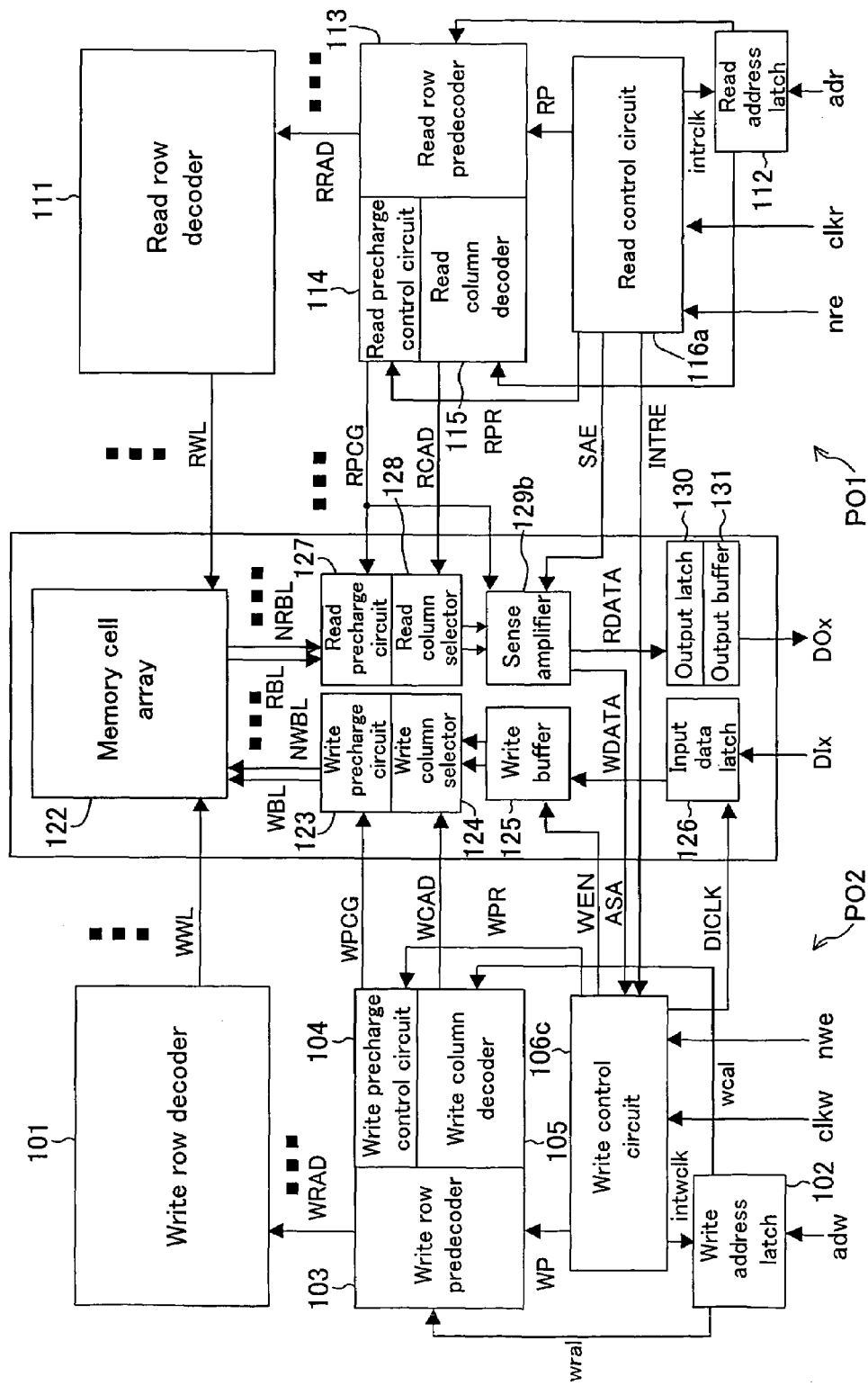
FIG. 10 is a block diagram of a dual-port memory of Embodiment 3 of the present invention.

Embodiment 3 of the present invention will be described with reference to the relevant drawings. FIG. 10 is a block diagram of a dual-port memory of this embodiment, which is different from the dual-port memory of Embodiment 1 shown in FIG. 1 in that a sensing confirmation signal ASA (first control signal) output from a sense amplifier 129b when the sense amplifier 129b detects sense amplification is input into a write control circuit 106c, in place of the read word line pulse signal RP.

Figure 15:
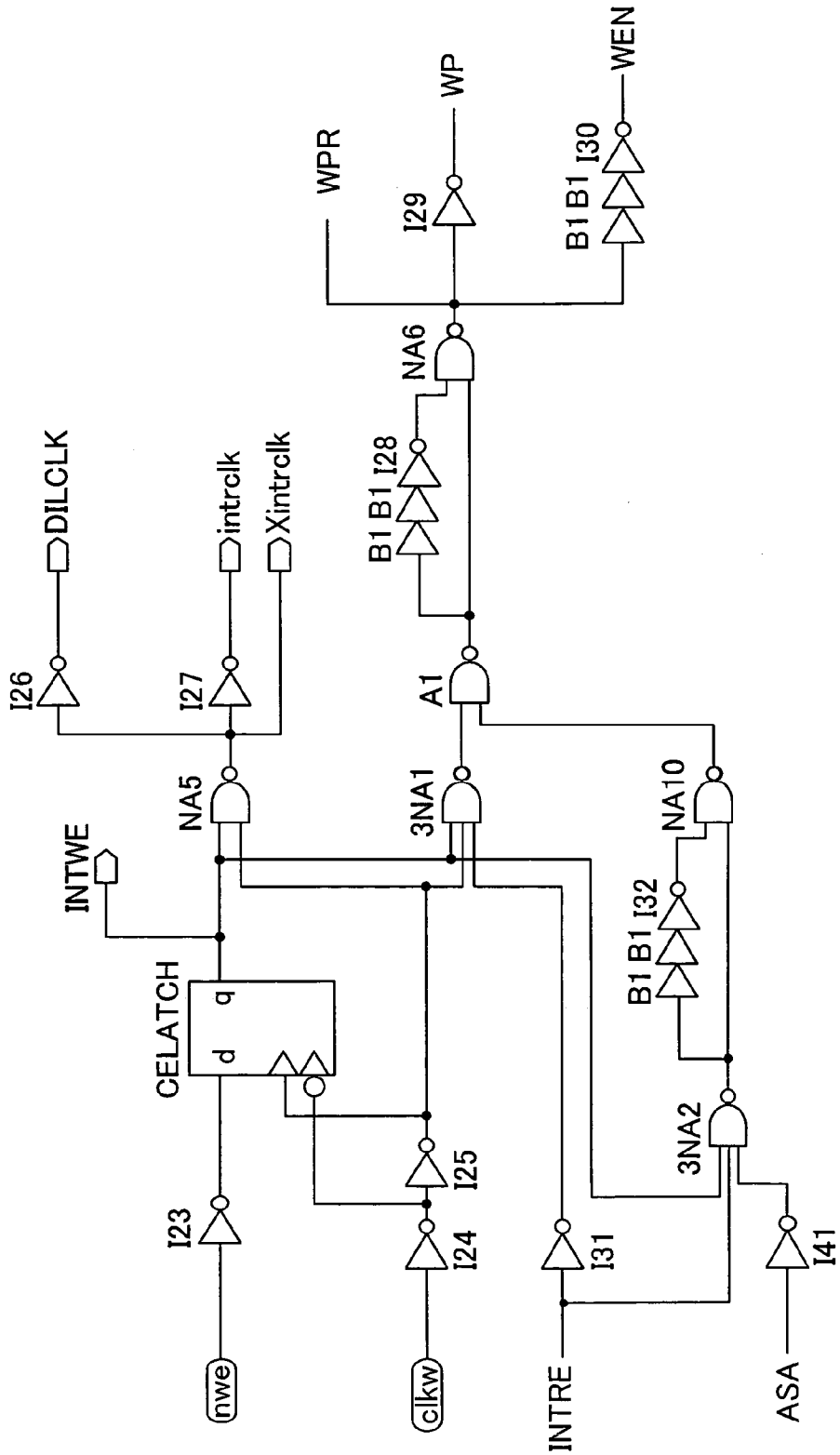
FIG. 15 is a detailed view of a write control circuit in Embodiment 3 of the present invention.

FIG. 15 shows a write control circuit 106c in this embodiment, in which the sensing confirmation signal ASA is sent via an inverter I41 to one of the input terminals of the 3-input NAND circuit 3NA2, in place of the read word line pulse signal RP that is input into the write control circuit 106a shown in FIG. 8.

Figure 11:
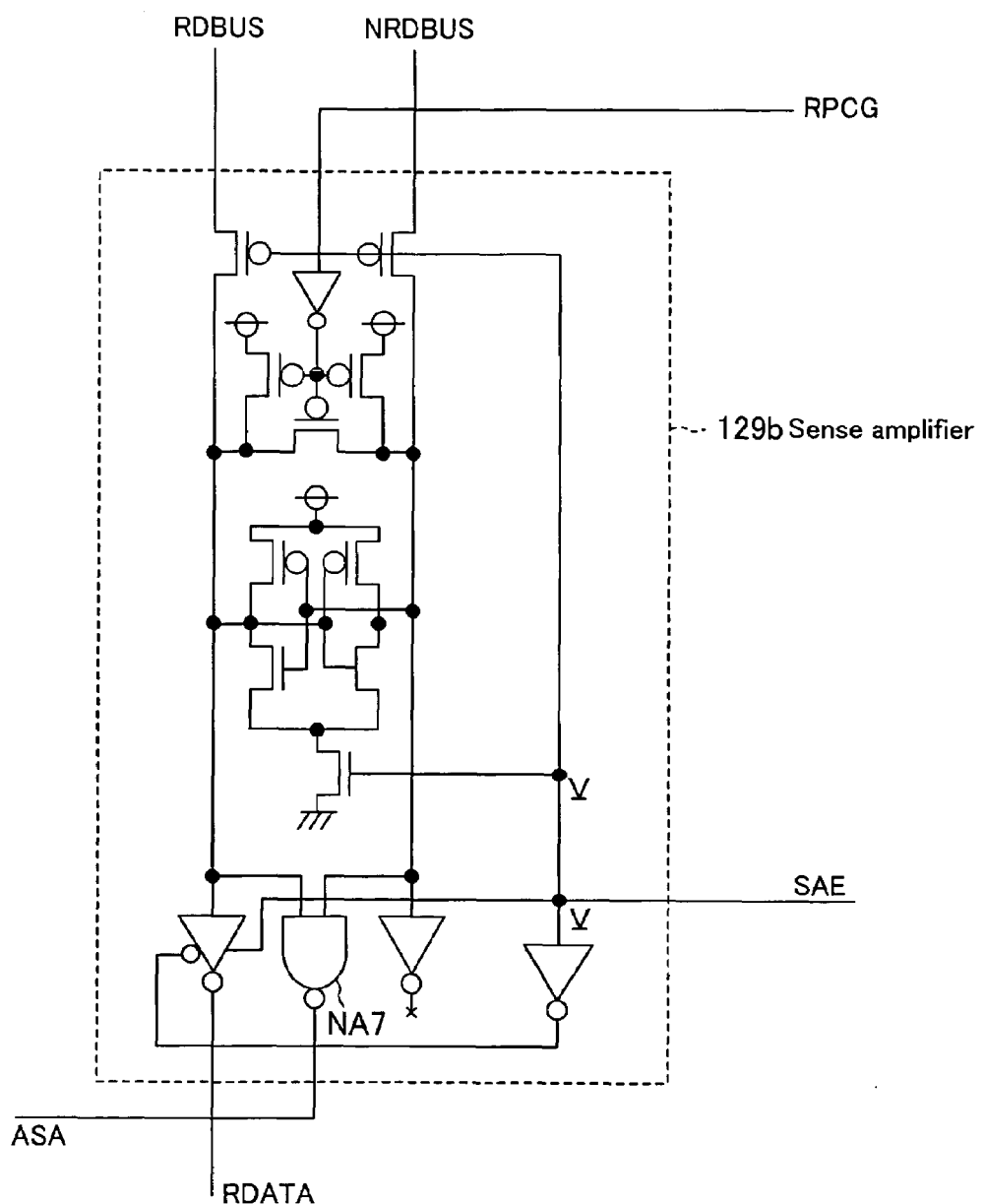
FIG. 11 is a detailed view of a sensing detection sense amplifier.

FIG. 11 shows the sense amplifier 129b in this embodiment that detects sense amplification by NAND-operating a read data line pair RDBUS/NRDBUS and generates the sensing confirmation signal ASA.

In Embodiment 3 of the present invention, the sensing confirmation signal ASA goes "H" when data is amplified with the sense amplifier 129b and is "L" when the sense amplifier 129b is inactive. The subsequent operation is substantially the same as that in Embodiment 1. In this embodiment, therefore, since the write operation is started at a time before the read word line RWL becomes inactive and after the potential of the read bit line pair RBL/NRBL has reliably been amplified, the read operation can be performed without being affected by the write bit line pair WBL/NWBL at all, and yet the frequency characteristics can be improved. The practical effect is therefore great.

In addition, since the circuit for outputting the sensing confirmation signal ASA is provided in the sense amplifier located closest to the write control circuit 106c, the delay due to routing of lines can be minimized and also the area can be reduced.

Embodiment 4

Figure 12:
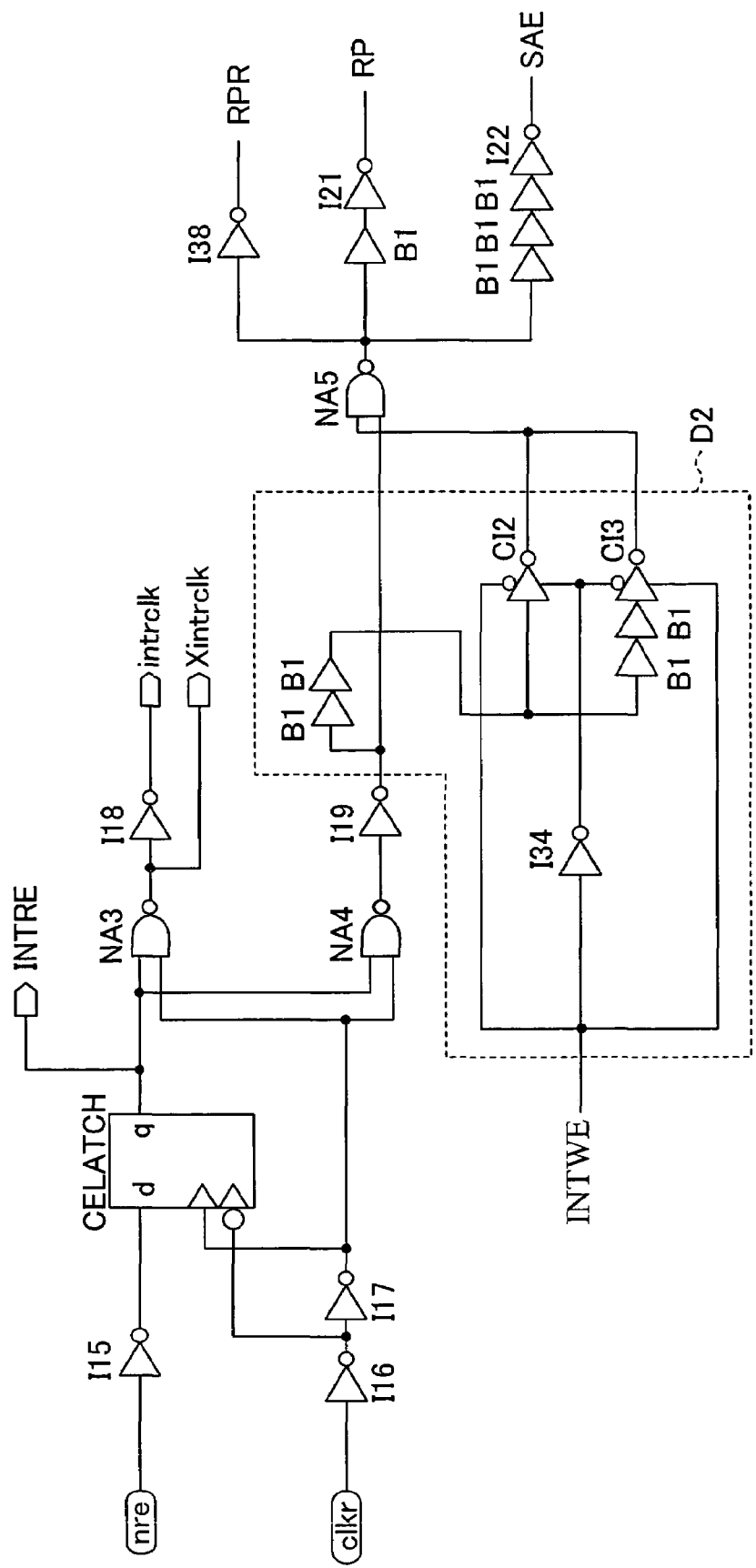
FIG. 12 is a detailed view of a read control circuit in Embodiment 4 of the present invention.
Figure 16:
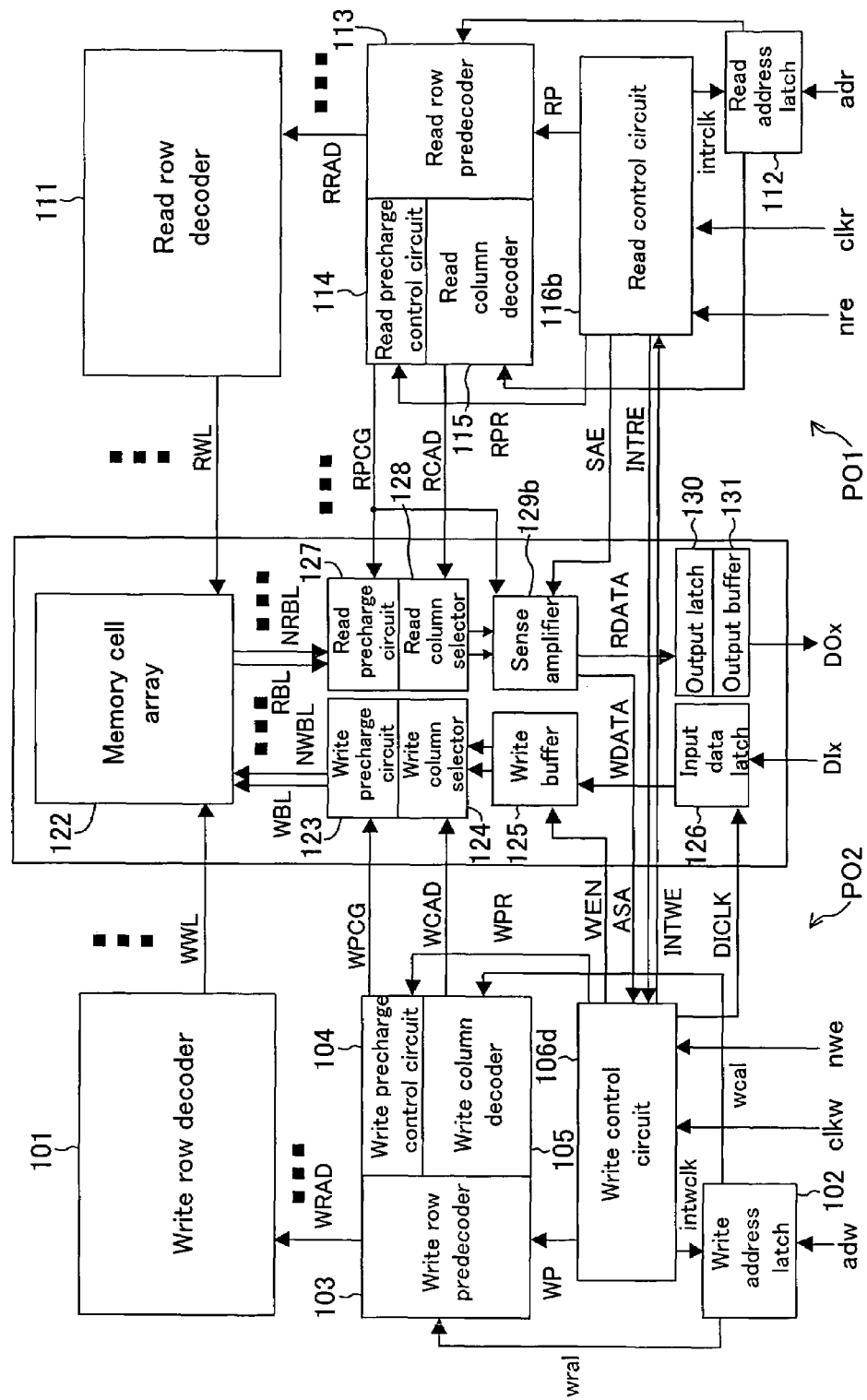
FIG. 16 is a block diagram of a dual-port memory of Embodiment 4 of the present invention.

Embodiment 4 of the present invention will be described with reference to the relevant drawings. FIG. 16 is a block diagram of a dual-port memory of this embodiment, which is different from the memory of Embodiment 3 shown in FIG. 10 in that the write enable signal INTWE as an output of a write control circuit 106d is input into a read control circuit 116b. FIG. 12 shows the read control circuit 116b in this embodiment, which is different from the read control circuit 106a shown in FIG. 7 in that a control operation delay circuit D2 for changing the delay time under the control of the write enable signal INTWE (second control signal) is provided, in place of the serial circuit composed of six buffers B1 and the inverter I20, immediately upstream of the NAND circuit NA5.

Specifically, in the replacing control operation delay circuit D2, the output of the inverter I19 first passes through two buffers B1 and is then branched into two parallel routes. One of the routes is connected to a clocked inverter CI2 with no buffer, and the other is connected to a serial circuit composed of two buffers B1 and a clocked inverter CI3. Both of the clocked inverters CI2 and CI3 are connected to one input terminal of the NAND circuit NA5. The two clocked inverters CI2 and CI3 are switched therebetween using the write enable signal INTWE output from the write control circuit 106d based on the external write control signal and a signal obtained by inverting the signal INTWE with an inverter I34, to enable selection between the delay time of a total of two buffers B1 output from the clocked inverter CI2 and the delay time of a total of four buffers B1 output from the clocked inverter CI3.

Having the circuit configuration described above, if the write enable signal INTWE input into the read control circuit 116b is "H" indicating that write is underway, the clocked inverter CI3 is selected. In this case, the delay amount of two buffers B1 is added between the inverter I19 and the NAND circuit NA5, to increase the pulse width of the read word line pulse signal RP. Contrarily, if write is not underway, the clocked inverter CI2 is selected, and the delay amount is suppressed to the amount of only two buffers B1 between the inverter I19 and the NAND circuit NA5.

As described above, the read control circuit 116b selects either the clocked inverter CI2 or CI3 for changing the delay amount in response to the write enable signal INTWE. Therefore, in the event that read operation is performed immediately after write operation overlapping the write operation, the pulse width of the read word line pulse signal RP can be made long, to ensure the read operation. The practical effect is therefore great.

Embodiment 5

Figure 13:
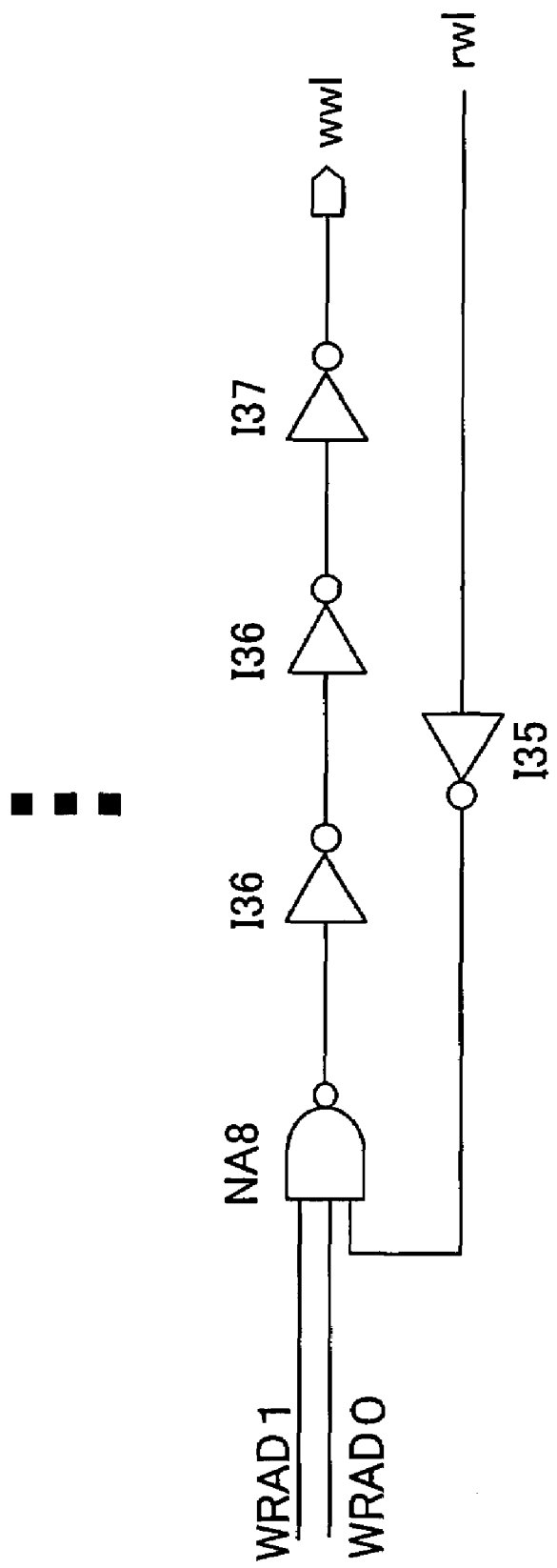
FIG. 13 is a detailed view of a row decoder for detecting read lines.

Embodiment 5 of the present invention will be described with reference to the relevant drawings. FIG. 13 shows a write row decoder 101' obtained by connecting the read word lines RWL of the read port for the same row addresses as the write word lines WWL to the write row decoder 101, to thereby detect the activation states of the read word lines RWL. In the write row decoder 101', a 3-input NAND circuit NA8 outputs "H" level during the time period when the read word line RWL is "H", and thus "L" level is output to the write word line WWL. This circuit configuration eliminates the necessity of providing an additional element in any circuit other than the write row decoder 101 to adjust the timing between the read operation and the write operation. Also, the existing wiring region can be utilized to provide the configuration of the write row decoder 101'. Thus, coincidence of signals on the write word line WWL and the read word line RWL can be avoided and the read timing can be sped up, without the necessity of increasing the area. The practical effect is therefore great.

Embodiment 6

Figure 14:
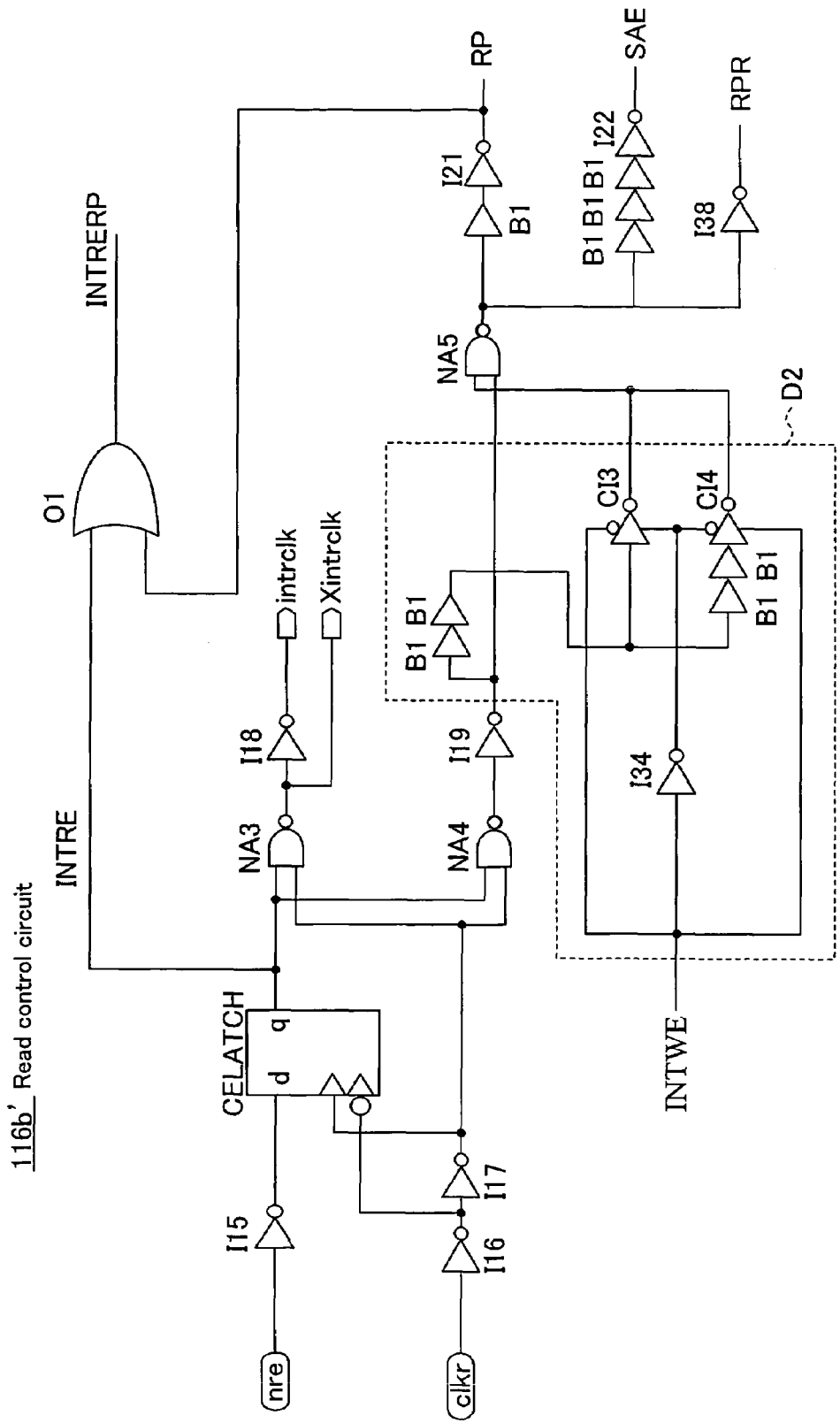
FIG. 14 is a detailed view of a read control circuit in Embodiment 6 of the present invention.

Embodiment 6 of the present invention will be described with reference to the relevant drawings. FIG. 14 shows a read control circuit 116b', which is different from the read control circuit 116b in Embodiment 4 shown in FIG. 12 in that the read enable signal INTRE and the read word line pulse signal RP are input into an OR circuit O1 to operate OR, and the output INTRERP of the OR circuit O1 as the operation result is sent to the write control circuit 106d in place of the read enable signal INTRE.

In Embodiment 6 of the present invention, the output INTRERP is "H" during the time period when the read enable signal INTRE is "H" or the read word line pulse signal RP is "H". That is, even if the read clock signal clkr as an external signal becomes "L", the write operation will not be started as long as the read operation continues, to thereby prevent simultaneous activation of the read word line RWL and the write word line WWL, and thus the frequency characteristics can be improved. The practical effect is therefore great.

Embodiment 7

Figure 17:
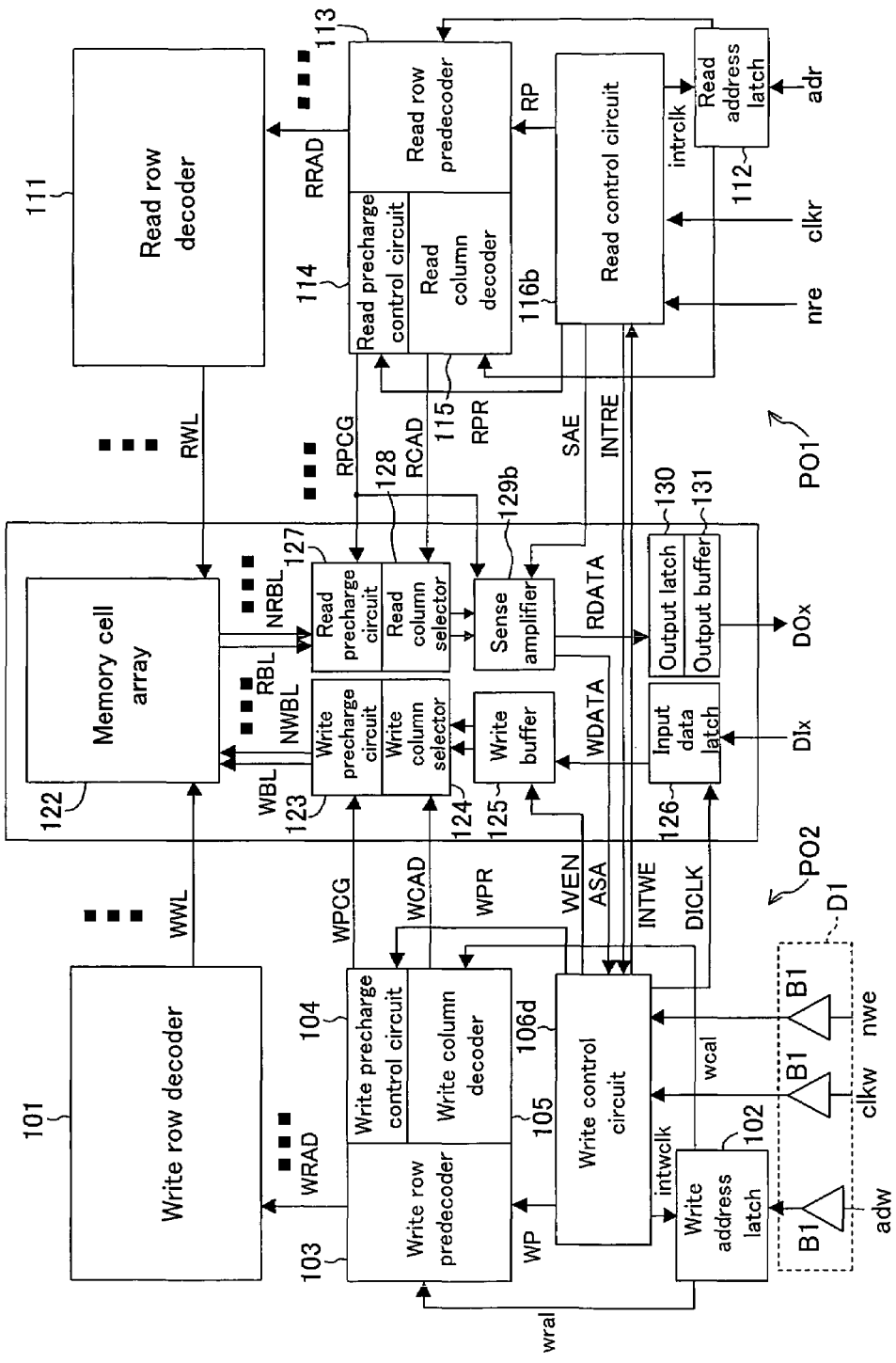
FIG. 17 is a block diagram of a dual-port memory of Embodiment 7 of the present invention.

Embodiment 7 of the present invention will be described with reference to the relevant drawings. FIG. 17 is a block diagram of a dual-port memory of this embodiment, in which external input signals for write, that is, the write clock clkw and the external write enable signal nwe (external write control signal) are input into the write control circuit 106d via a delay circuit (external input signal delay circuit) D1 composed of a buffer B1, and a write address signal adw as one of the external input signals is input into the write address latch 102 via a delay circuit (external input signal delay circuit) D1 composed of a buffer B1. The buffer B1 gives a delay equal to or larger than the delay required for the read enable signal INTRE output from the read control circuit 116b to reach the write control circuit 106d, and is provided for delaying the timing of input of the external input signals for write into the write control circuit 106d and the timing of input of the write address signal adw into the write address latch 102 behind the timing of input of the read enable signal INTRE into the write control circuit 106d from the read control circuit 116b.

In this embodiment, as shown in FIG. 17, the sensing confirmation signal ASA is sent from the sense amplifier 129b to the write control circuit 106d, and the write enable signal INTWE is sent from the write control circuit 106d to the read control circuit 116b, to give measures against simultaneous occurrence of read and write. Moreover, in this embodiment, it is possible to prevent the possibility of missing simultaneous occurrence of read and write due to some deviation of timing. The practical effect is therefore great.

In this embodiment, the buffer B1 was provided for the externally supplied write clock clkw and external write enable signal nwe before being input into the write control circuit 106d and for the externally supplied write address adw before being input into the write address latch 102. Alternatively, only the write clock clkw may be delayed using the buffer B1 before being input into the write control circuit 106d.

Embodiment 8

Figure 18:
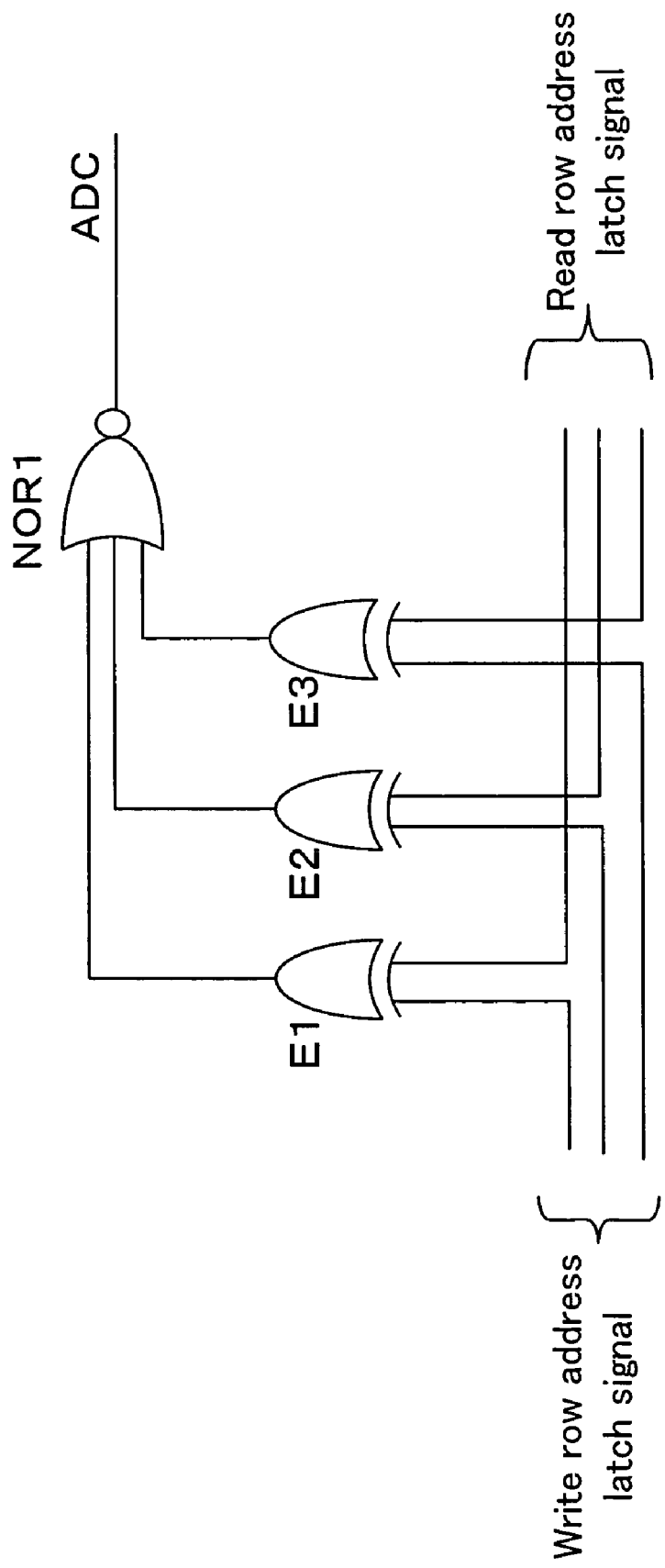
FIG. 18 is a detailed view of an address comparison circuit.

Embodiment 8 of the present invention will be described with reference to the relevant drawings. FIG. 18 shows an address comparison circuit 140 for detecting a match or a mismatch between the write row address and the read row address. In the address comparison circuit 140, exclusive OR of the write row address and the read row address is computed with arithmetic circuits E1, E2 and E3, and the outputs of the three arithmetic circuits are NOR-operated with a NOR circuit NOR1 to output a signal ADC. That is, if the write and read row addresses match with each other, the address comparison circuit 140 outputs "H" level.

FIG. 20 shows the write control circuit 106d in this embodiment, which is different from the write control circuit 106c in FIG. 15 in that the output of a NAND circuit NA9, which receives the read enable signal INTRE and the output signal ADC of the address comparison circuit 140 as two inputs, is used in place of the read enable signal INTRE input into the 3-input NAND circuit 3NA1 via the inverter I31. With this configuration, the write operation will be delayed to follow the read operation only when the read operation is underway and the write row address matches with the read row address. Therefore, for access other than the access to the same row address, the frequency characteristics can be improved while the sped-up access is maintained. The practical effect can therefore be great.

Embodiment 9

Figure 19:
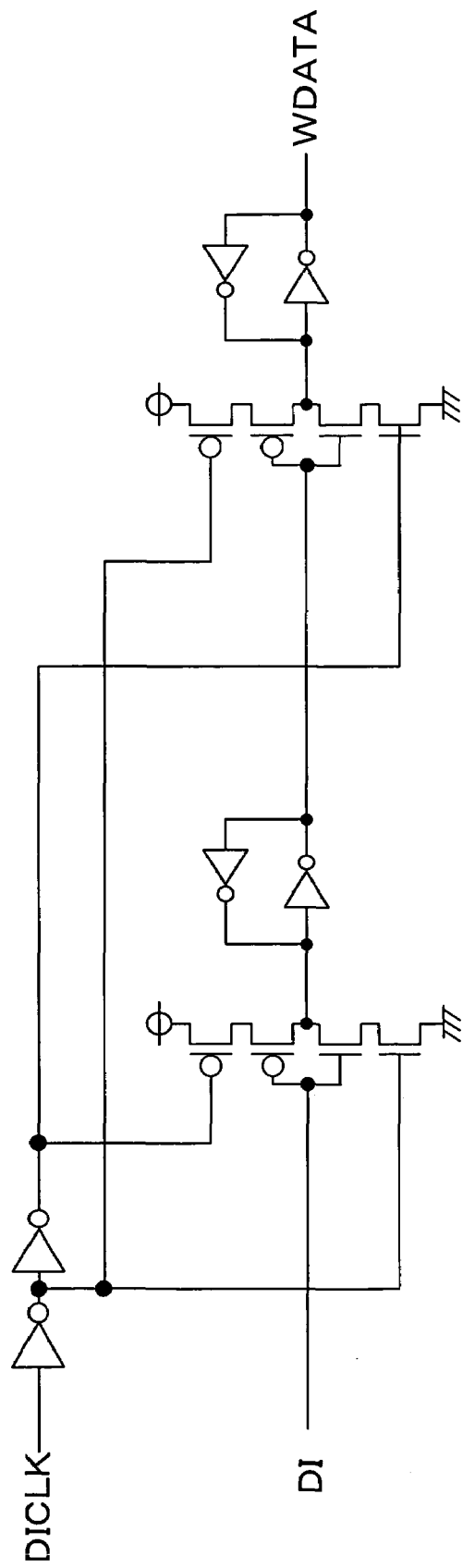
FIG. 19 is a detailed view of an input data latch or an address latch in Embodiment 9 of the present invention.

Embodiment 9 of the present invention will be described with reference to the relevant drawings. FIG. 19 shows the write address latch 102 for latching an address for write for one period, which is substantially composed of two sets of the combination of an clocked inverter and a latch circuit, which is similar to that of the input data latch 126 shown in FIG. 6, and two inverters. By latching input data or an address for one period with the latch of this configuration, write can be continued even during the clock "L" period. Therefore, the frequency characteristics can be improved, and thus the practical effect is great.

While the present invention has been described in preferred embodiments, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. A semiconductor memory device having a plurality of memory cells accessible from a plurality of ports, comprising:

first access transistors for electrically connecting bit lines of a first port among the plurality of ports to the memory cells in response to a first activation signal;

second access transistors for electrically connecting bit lines of a second port among the plurality of ports to the memory cells in response to a second activation signal, the first access transistors and the second access transistors being connected to respective same nodes of the memory cells;

a first row decoder for sending the first activation signal to the first access transistors via first word lines;

a second row decoder for sending the second activation signal to the second access transistors via second word lines;

a first control circuit for outputting a first control signal based on a first external control signal supplied externally to control the output of the first activation signal from the first row decoder with the first control signal; and a second control circuit for outputting a second control signal based on a second external control signal supplied externally to control the output of the second activation signal from the second row decoder with the second control signal, wherein when the memory cells receive access from the first port, the second control circuit delays the second control signal in response to the first control signal output from the first control circuit or a signal based on the first control signal, to delay the second activation signal output from the second row decoder to the second access transistors behind the output of the first activation signal by a predetermined time.

2. The device of claim 1, wherein the first port, the first access transistor, the first row decoder, the first activation signal, the first word lines, the first external control signal and the first control circuit are respectively a read port, a read access transistor, a read row decoder, a read activation signal, read work lines, external read control signals and a read control circuit, and the second port, the second access transistor, the second row decoder, the second activation signal, the second word lines, the second external control signal and the second control circuit are respectively a write port, a write access transistor, a write row decoder, a write activation signal, write work lines, external write control signals and a write control circuit.

3. The device of claim 2, further comprising:
a read precharge circuit for precharging the bit lines of the read port; and
a read precharge control circuit for supplying a read precharge signal to the read precharge circuit to control the precharge,
wherein when access to the memory cells is made from the read port, the write control circuit delays its output signal generated based on the external write control signals, in response to the read enable signal output from the read control circuit and the read precharge signal output from the read precharge control circuit, to delay the write activation signal output from the write row decoder to the write access transistors behind the output of the read activation signal by a predetermined time.

4. The device of claim 2, further comprising a sense amplifier for amplifying data read from the memory cells,
wherein when access to the memory cells is made from the read port, the write control circuit delays its output signal generated based on the external write control signals, in response to the read enable signal output from the read control circuit and a sense amplifier startup signal output from the read control circuit for starting the sense amplifier, to delay the write activation signal output from the write row decoder to the write access transistors behind the output of the read activation signal by a predetermined time.

5. The device of claim 2, wherein the read row decoder sends the read activation signal to the read access transistors based on a read word line startup signal output from the read control circuit, and
when access to the memory cells is made from the read port, the write control circuit delays its output signal generated based on the external write control signals, in response to the read enable signal and the read word line startup signal output from the read control circuit, to delay the write activation signal output from the write row decoder to the write access transistor behind the output of the read activation signal by a predetermined time.

6. The device of claim 2, further comprising a sense amplifier for amplifying data read from the memory cells, and the sense amplifier includes a sensing confirmation signal generation circuit for outputting a sensing confirmation signal once sense amplification is performed,
wherein when access to the memory cells is made from the read port, the write control circuit delays its output signal generated based on the external write control signals, in response to the read enable signal output from the read control circuit and the sensing confirmation signal output from the sensing confirmation signal generation circuit, to delay the write activation signal output from the write row decoder to the write access transistor behind the output of the read activation signal by a predetermined time.

7. The device of claim 6, wherein the sense amplifier located closest to the write control circuit includes the sensing confirmation signal generation circuit.

8. The device of claim 3, further comprising an address comparison circuit for comparing row addresses from the plurality of ports with each other and outputting the comparison result of a match or a mismatch of the row addresses to the write control circuit,
wherein the write control circuit controls the time from the input of the external write control signals until the output of the write activation signal based on the comparison result from the address comparison circuit.

9. The device of claim 2, wherein the row decoder of one of the write port and the read port is connected with the word lines of the other port for the same row addresses, and
the word lines of the one port for the same row addresses are activated only when the relevant word lines of the other port are inactive.

10. The device of claim 3, further comprising a write address latch for receiving a write address signal supplied externally and outputting write row address information and write column address information based on the write address signal under the control of the write control circuit,
wherein an external input signal delay circuit is provided, on the external-input side of the write control circuit and the write address latch, for delaying the external write control signals so that the external write control signals be input into the write control circuit and the write address latch behind the timing of input of the read enable signal output from the read control circuit into the write control circuit.

11. A semiconductor memory device having a plurality of memory cells accessible from a plurality of ports, comprising:
first access transistors for electrically connecting bit lines of a first port among the plurality of ports to the memory cells in response to a first activation signal;
second access transistors for electrically connecting bit lines of a second port among the plurality of ports to the memory cells in response to a second activation signal, the first access transistors and the second access transistors being connected to respective same nodes of the memory cells;
a first row decoder for supplying the first activation signal to the first access transistors via first word lines;
a second row decoder for supplying the second activation signal to the second access transistors via second word lines;
a first control circuit for controlling the output of the first activation signal via the first row decoder based on first external control signal supplied externally;
a second control circuit for controlling the output of the second activation signal via the second row decoder based on second external control signal supplied externally; and
a control operation delay circuit, provided in the first control circuit, for increasing the output time period of the first activation signal in response to a signal based on the second external control signal if access to the memory cells is made from the first port during the time period when access to the memory cells from the second port is underway.

12. The device of claim 11, wherein the first port, the first access transistor, the first row decoder, the first activation signal, the first word lines, the first external control signal and the first control circuit are respectively a read port, a read access transistor, a read row decoder, a read activation signal, read work lines, external read control signals and a read control circuit, and
the second port, the second access transistor, the second row decoder, the second activation signal, the second word lines, the second external control signal and the second control circuit are respectively a write port, a write access transistor, a write row decoder, a write activation signal, write work lines, external write control signals and a write control circuit.

13. The device of claim 12, further comprising:
a write address latch for latching address data for one period; and
a write input data latch for latching input data for one period.

14. The device of claim 12, wherein the read control circuit outputs a read enable signal when receiving the external read control signals externally, and also outputs a read word line startup signal as a signal based on the operation of the read row decoder outputting the read activation signal to the read word lines, and
the read enable signal is OR-operated with the read word line startup signal to provide a second read enable signal, and the second read enable signal is input into the write control circuit.

15. The device of claim 14, wherein the external write control signals include a write clock signal for clock control of write operation, and
the write clock signal is input into the write control circuit via an external input signal delay circuit son that the write clock signal be delayed behind the timing of input of the read enable signal output from the read control circuit into the write control circuit.

* * * * *